United States Patent
Takahashi

(10) Patent No.: US 11,454,674 B2
(45) Date of Patent: Sep. 27, 2022

(54) SECONDARY BATTERY SYSTEM AND METHOD FOR ESTIMATING SOC OF SECONDARY BATTERY

(71) Applicant: TOYOTA JIDOSHA KABUSHIKI KAISHA, Toyota (JP)

(72) Inventor: Kenji Takahashi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 775 days.

(21) Appl. No.: 16/214,530

(22) Filed: Dec. 10, 2018

(65) Prior Publication Data
US 2019/0178952 A1    Jun. 13, 2019

(30) Foreign Application Priority Data
Dec. 12, 2017 (JP) .............................. JP2017-237882

(51) Int. Cl.
*G01R 31/3842* (2019.01)
*G01R 31/36* (2020.01)
*G01R 31/3828* (2019.01)

(52) U.S. Cl.
CPC ..... *G01R 31/3842* (2019.01); *G01R 31/3648* (2013.01); *G01R 31/3828* (2019.01)

(58) Field of Classification Search
CPC ................................................ G01R 31/3842
See application file for complete search history.

(56) References Cited

U.S. PATENT DOCUMENTS

| 2015/0028815 A1* | 1/2015 | Osawa ................. H02J 7/0049 320/134 |
| 2015/0253389 A1 | 9/2015 | Arai et al. |
| 2015/0355285 A1 | 12/2015 | Nishigaki et al. |

FOREIGN PATENT DOCUMENTS

| JP | 2011-097729 A | 5/2011 |
| JP | 2014-139521 A | 7/2014 |
| JP | 2015-166710 A | 9/2015 |
| JP | 2017-020855 A | 1/2017 |

OTHER PUBLICATIONS

V. A. Sethuraman et al., "In Situ Measurements of Stress-Potential Coupling in Lithiated Silicon," Journal of The Electrochemical Society, Sep. 25, 2010, pp. A1253-A1261, vol. 157, No. 11.

* cited by examiner

*Primary Examiner* — John E Breene
*Assistant Examiner* — Jeffrey C Morgan
(74) *Attorney, Agent, or Firm* — Sughrue Mion, PLLC

(57) ABSTRACT

If a charging quantity charged to a battery pack since switching from discharging to charging is more than or equal to a reference charging quantity, an ECU estimates the SOC from the OCV by referring to a charging OCV. If a discharging quantity discharged from the battery pack since switching from charging to discharging is more than or equal to a reference discharging quantity, the ECU estimates the SOC from the OCV by referring to a discharging OCV. If the electric quantity is less than the reference charging quantity or if the electric quantity is more than the reference discharging quantity, the ECU estimates the SOC from the OCV using a straight line for supplementing SOC-OCV characteristics in a region enclosed by the charging OCV and the discharging OCV.

7 Claims, 13 Drawing Sheets

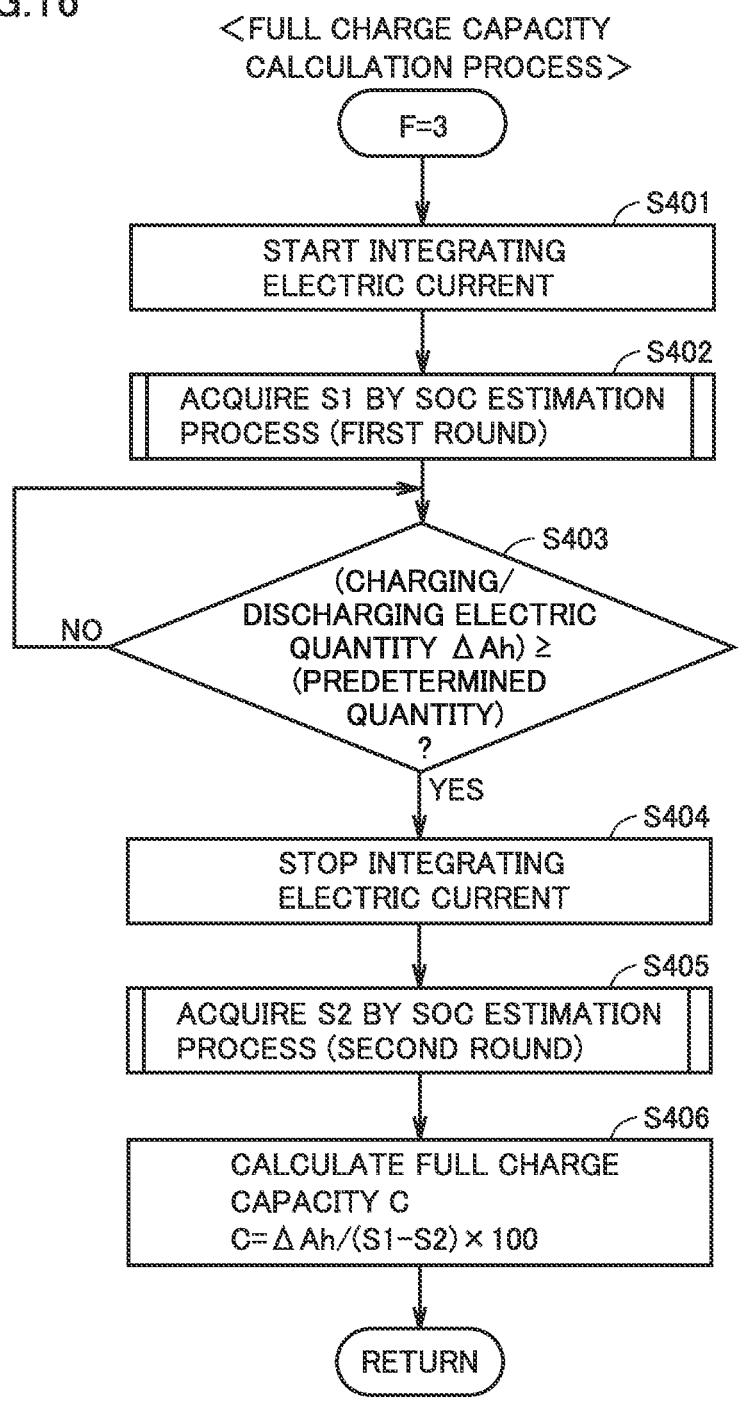

SECONDARY BATTERY SYSTEM AND METHOD FOR ESTIMATING SOC OF SECONDARY BATTERY

This nonprovisional application is based on Japanese Patent Application No. 2017-237882 filed on Dec. 12, 2017 with the Japan Patent Office, the entire contents of which are hereby incorporated by reference.

BACKGROUND

Field

The present disclosure relates to a secondary battery system and a method for estimating the SOC of a secondary battery, and particularly to a technology to estimate the SOC from the OCV using the SOC-OCV characteristics (SOC-OCV curve) of a secondary battery.

Description of the Background Art

In order to properly protect and fully utilize the secondary battery, it is important to estimate the SOC of a secondary battery accurately. As a typical technique for estimating the SOC of a secondary battery, estimating a SOC from an OCV using the SOC-OCV curve of a secondary battery is widely known.

Some systems of secondary batteries have a significant gap between the discharging curve, which is a SOC-OCV curve obtained when the secondary battery is discharged from the fully charged state, and the charging curve, which is a SOC-OCV curve obtained when the secondary battery is charged from the fully discharged state. Existence of such a gap between the charging curve and the discharging curve is also referred to as existence of "hysteresis" in the SOC-OCV curve. For example, Japanese Patent Laying-Open No. 2015-166710 discloses a technology to estimate the SOC from the OCV by considering the hysteresis.

SUMMARY

Depending on the history of use of a secondary battery, the state of the secondary battery (a combination of the OCV and the SOC of the secondary battery) may be or may not be plotted on the charging curve or the discharging curve. In other words, in some cases the SOC of a secondary battery can be estimated from the OCV by referring to the charging curve or the discharging curve; whereas in other cases the SOC cannot be accurately estimated merely by referring to the charging curve or the discharging curve. This suggests that a method for estimating the SOC should be selected as appropriate in accordance with the history of use of the secondary battery. The technology disclosed in Japanese Patent Laying-Open No. 2015-166710 does not clearly provide a criterion for such selection and thus has room for improvement of accuracy in SOC estimation.

The present disclosure has been made to solve such a problem, and an object of the present disclosure is to improve the accuracy in SOC estimation for a secondary battery system that estimates the SOC from the OCV of a secondary battery using the correspondence relation between the SOC and the OCV.

Another object of the present disclosure is to improve the accuracy in SOC estimation for a method for estimating the SOC from the OCV of a secondary battery using the correspondence relation between the SOC and the OCV.

(1) A secondary battery system according to one aspect of the present disclosure includes a secondary battery and a controller configured to estimate the SOC of the secondary battery. The controller is configured to execute a "SOC estimation process" for estimating a SOC of the secondary battery from an OCV of the secondary battery using a charging curve and a discharging curve. The charging curve represents SOC-OCV characteristics of the secondary battery charged from a fully discharged state to a fully charged state, and the discharging curve represents SOC-OCV characteristics of the secondary battery discharged from the fully charged state to the fully discharged state. In the SOC estimation process, the controller is configured to calculate a first electric quantity and a second electric quantity. The first electric quantity is an electric quantity charged to the secondary battery since switching from discharging to charging, and the second electric quantity is an electric quantity discharged from the secondary battery since switching from charging to discharging. If the first electric quantity is more than a first reference electric quantity, the controller estimates the SOC from the OCV of the secondary battery by referring to the charging curve. If the second electric quantity is more than a second reference electric quantity, the controller estimates the SOC from the OCV of the secondary battery by referring to the discharging curve. If the first electric quantity is less than the first reference electric quantity or if the second electric quantity is less than the second reference electric quantity, the controller estimates the SOC from the OCV of the secondary battery using a predetermined correspondence relation for supplementing SOC-OCV characteristics of the secondary battery in a region enclosed by the charging curve and the discharging curve of a region defined by the SOC and the OCV of the secondary battery.

(2) Preferably, the first electric quantity is an electric quantity charged to the secondary battery since switching from discharging to charging on the discharging curve. The second electric quantity is an electric quantity discharged from the secondary battery since switching from charging to discharging on the charging curve.

(3) Preferably, the controller is configured to estimate the SOC from the OCV of the secondary battery using, as the correspondence relation, a linear approximation relation between the SOC and the OCV of the secondary battery in the region. The linear approximation relation is not limited to a perfect linear relation between the SOC and the OCV. The linear approximation relation may be a relation that can be basically regarded as linear, including a slight degree of non-linearity.

(4) Preferably, the controller includes a memory storing a correlation among a constant of proportionality in the linear approximation relation, a temperature of the secondary battery, and the SOC of the secondary battery. The controller is configured to execute the SOC estimation process repeatedly, and calculate the constant of proportionality from the temperature of the secondary battery and from the SOC of the secondary battery estimated by the SOC estimation process performed last time.

(5) Preferably, the controller is configured to estimate the SOC from the OCV of the secondary battery using a constant of proportionality in the linear approximation relation and using the SOC and the OCV of the secondary battery of a time of switching between charging and discharging.

(6) Preferably, in the SOC estimation process, the controller is configured to estimate the SOC from the OCV of the secondary battery by referring to the discharging curve if an electric quantity discharged from the secondary battery since a first reference time is larger than an electric quantity charged to the secondary battery since the first reference time (in the case of overdischarge), the first reference time being a time of switching from discharging to charging on the discharging curve. The controller is configured to estimate the SOC from the OCV of the secondary battery by referring to the charging curve if an electric quantity charged to the secondary battery since a second reference time is larger than an electric quantity discharged from the secondary battery since the second reference time (in the case of overcharge), the second reference time being a time of switching from charging to discharging on the charging curve.

(7) In a method for estimating the SOC of a secondary battery according to another aspect of the present disclosure, a charging curve and a discharging curve are predetermined. The charging curve represents a correspondence relation between the OCV and the SOC of the secondary battery obtained when the secondary battery is charged from a fully discharged state to a fully charged state. The discharging curve represents a correspondence relation between the OCV and the SOC of the secondary battery obtained when the secondary battery is discharged from the fully charged state to the fully discharged state. The method for estimating the SOC includes first to third steps. The first step is, if a first electric quantity charged to the secondary battery since switching from discharging to charging is more than a first reference electric quantity, estimating the SOC from the OCV of the secondary battery by referring to the charging curve. The second step is, if a second electric quantity discharged from the secondary battery since switching from charging to discharging is more than a second reference electric quantity, estimating the SOC from the OCV of the secondary battery by referring to the discharging curve. The third step is, if the first electric quantity is less than the first reference electric quantity or if the second electric quantity is less than the second reference electric quantity, estimating the SOC from the OCV of the secondary battery using a predetermined correspondence relation for supplementing SOC-OCV characteristics of the secondary battery in a region enclosed by the charging curve and the discharging curve of a region defined by the SOC and the OCV of the secondary battery.

According to the behavior of a secondary battery found by the present inventor, if a secondary battery is charged in more than or equal to a predetermined electric quantity (first reference electric quantity), the state of the secondary battery (a combination of the SOC and the OCV) is plotted on the charging curve, regardless of the SOC of the secondary battery. Also, if the secondary battery is discharged in more than or equal to a predetermined electric quantity (second reference electric quantity), the state of the secondary battery is plotted on the discharging curve, regardless of the SOC of the secondary battery. In these cases, therefore, the configuration of the above (1) or the method of the above (7) refers to the charging curve or the discharging curve, thus accurately estimating the SOC from the OCV of the secondary battery.

If the first electric quantity is less than the first reference electric quantity or if the second electric quantity is less than the second reference electric quantity, the state of the secondary battery is plotted in the region enclosed by the charging curve and the discharging curve. In these cases, therefore, the configuration of the above (1) or the method of the above (7) uses a predetermined correspondence relation for supplementing the SOC-OCV characteristics of the secondary battery in the region, thus accurately estimating the SOC from the OCV of the secondary battery.

According to the configuration of the above (3), using the linear approximation relation between the SOC and the OCV of the secondary battery simplifies the calculation for estimating the SOC.

According to the configuration of the above (4), the constant of proportionality reflects the influences of the temperature and the SOC of the secondary battery. This improves accuracy in calculation of the constant of proportionality, thus further improving accuracy in SOC estimation.

According to the configuration of the above (5), using the linear approximation relation simplifies the calculation for estimating the SOC, as with the configuration of the above (3).

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 16 is a flowchart for explaining a full charge capacity calculation process in an embodiment 2.

DESCRIPTION OF THE PREFERRED EMBODIMENTS

Figure 1:
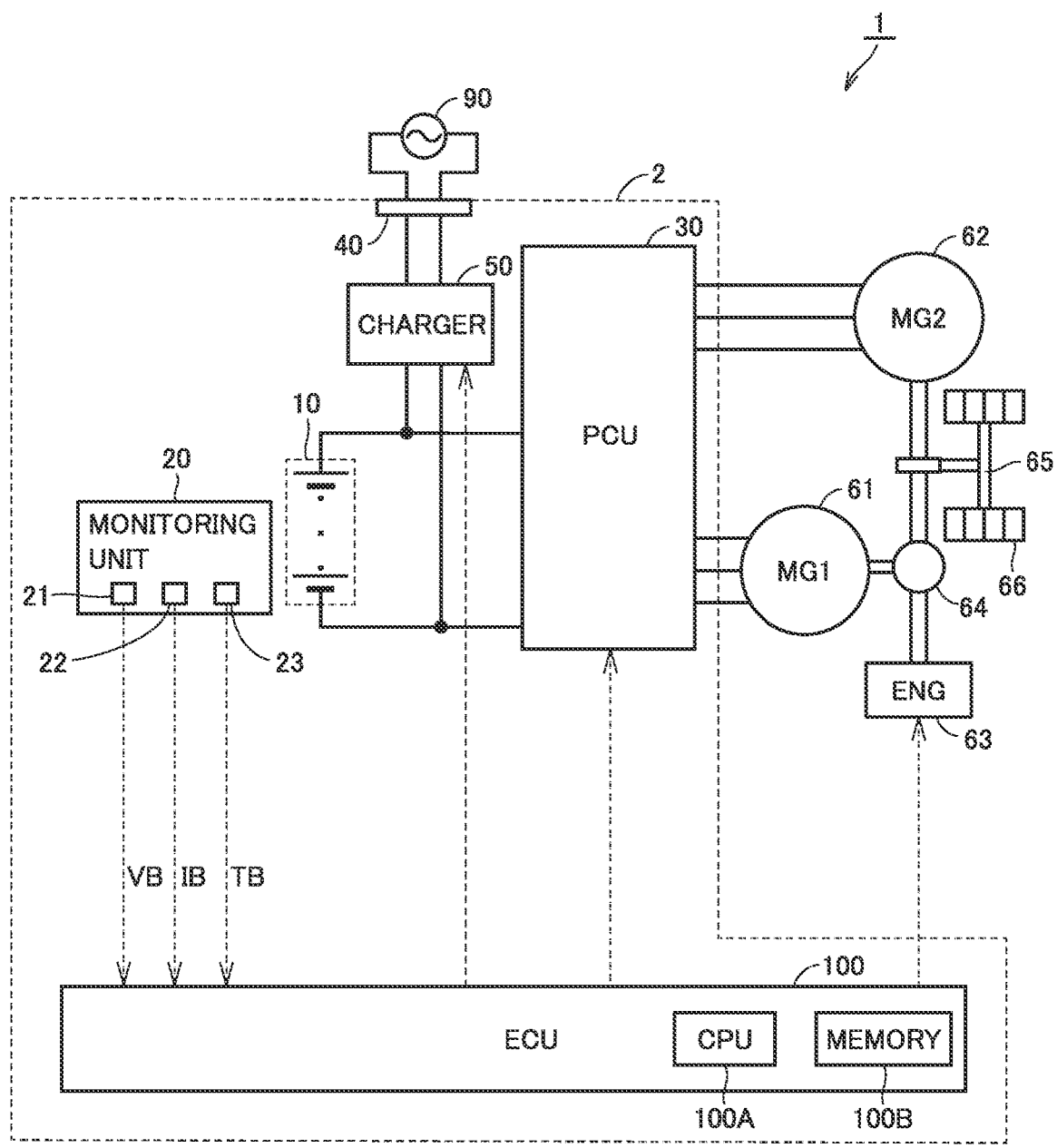
FIG. 1 schematically shows a general configuration of a vehicle having a secondary battery system according to an embodiment 1.

Embodiments of the present disclosure are described in detail hereinafter with reference to the drawings. Identical or corresponding parts in the drawings are identically denoted, and the explanation thereof is not repeated.

The following describes a case in which a secondary battery system according to the present embodiment is mounted on a hybrid vehicle (more particularly, on a "plug-in hybrid vehicle"). The use of the secondary battery system according to the present embodiment, however, is not limited to a hybrid vehicle. It is applicable to every vehicle that has a battery pack for traveling, such as an electric vehicle and a fuel cell vehicle. Further, the secondary battery system according to the present embodiment is not limited to an on-vehicle system but may be a stationary system.

Embodiment 1

<Configuration of Secondary Battery System>

FIG. 1 schematically shows a general configuration of a vehicle 1 having a secondary battery system according to embodiment 1. With reference to FIG. 1, vehicle 1, a plug-in hybrid vehicle, includes a secondary battery system 2, motor generators 61, 62, an engine 63, a motive power dividing device 64, a drive shaft 65, and a drive wheel 66. Secondary battery system 2 includes a battery pack 10, a monitoring unit 20, a power control unit (PCU) 30, an inlet 40, a charger 50, and an electronic control unit (ECU) 100.

Each of motor generators 61, 62 is an AC dynamo-electric machine, such as a three-phase AC synchronous motor having a rotor with an embedded permanent magnet. Motor generator 61 is used mainly as a power generator to be driven by engine 63 via motive power dividing device 64. Electric power generated by motor generator 61 is supplied to motor generator 62 or battery pack 10 through PCU 30.

Motor generator 62 operates mainly as an electric motor for driving drive wheel 66. Motor generator 62 is driven by receiving at least one of electric power from battery pack 10 and electric power generated by motor generator 61. The driving force from motor generator 62 is transmitted to drive shaft 65. At the time of a low acceleration during braking of the vehicle or traveling on a descending slope, motor generator 62 operates as a power generator to perform regenerative power generation. Electric power generated by motor generator 62 is supplied to battery pack 10 through PCU 30.

Engine 63 is an internal combustion engine to output a motive power by converting combustion energy generated by combusting an air-fuel mixture into kinetic energy for movable parts, such as a piston and a rotor.

Motive power dividing device 64 includes epicyclic gearing (not shown) having three rotating shafts of a sun gear, a carrier, and a ring gear, for example. Motive power dividing device 64 divides motive power outputted from engine 63 into motive power for driving motor generator 61 and motive power for driving drive wheel 66.

Figure 2:
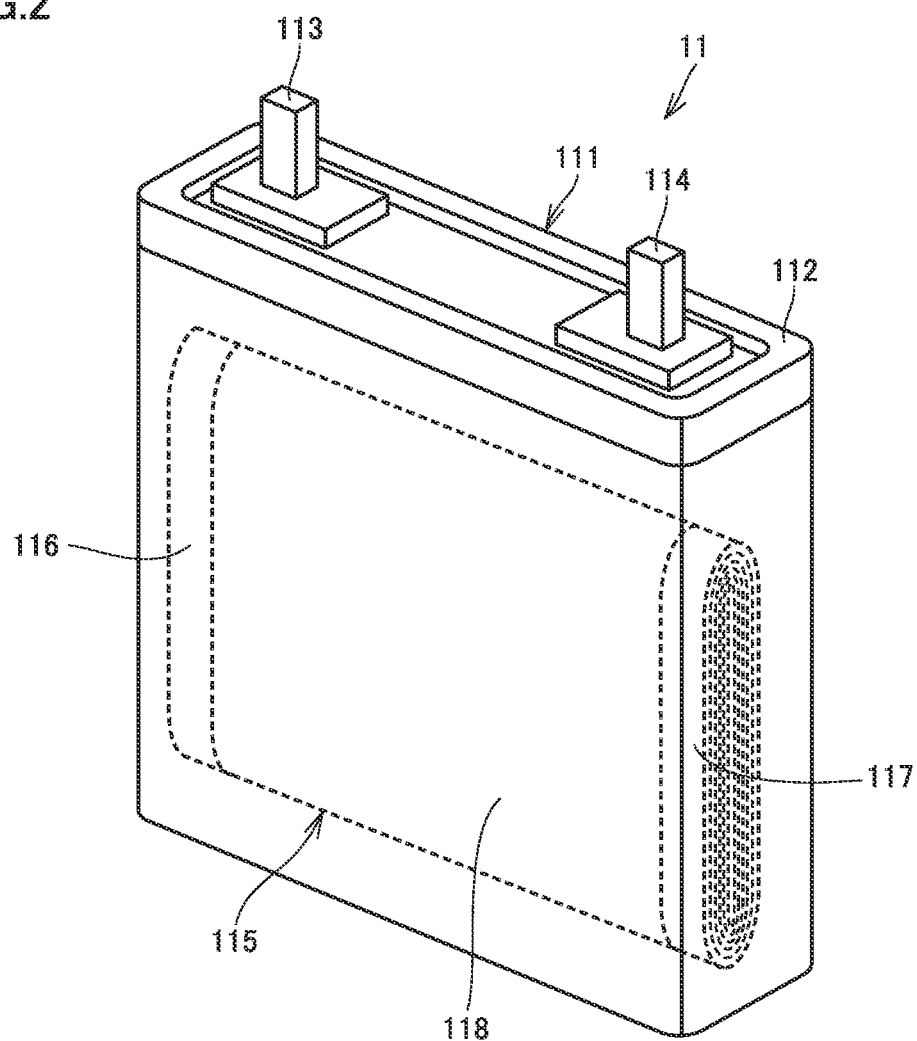
FIG. 2 is a diagram for explaining a configuration of each cell in more detail.

Battery pack 10 includes a plurality of cells 11 (see FIG. 2). In the present embodiment, each cell is a lithium-ion secondary battery. The lithium-ion secondary battery may have a liquid electrolyte, a polymer electrolyte, or an all-solid electrolyte.

Battery pack 10 stores electric power for driving motor generators 61, 62 and supplies the electric power to motor generators 61, 62 through PCU 30. Battery pack 10 is charged with electric power generated by motor generators 61, 62 through PCU 30.

Monitoring unit 20 includes a voltage sensor 21, an electric current sensor 22, and a temperature sensor 23. Voltage sensor 21 detects a voltage of each cell 11 included in battery pack 10. Electric current sensor 22 detects an electric current IB inputted to and outputted from battery pack 10. Electric current IB is positive at the time of charging and is negative at the time of discharging. Temperature sensor 23 detects a temperature of each cell 11. Each sensor outputs a detection result to ECU 100.

Voltage sensor 21 may detect a voltage VB for a plurality of cells 11 connected in series, for example, as a unit of monitoring. Temperature sensor 23 may detect a temperature TB for a plurality of adjacent cells 11 as a unit of monitoring. Any unit of monitoring may be employed in the present embodiment. For simplicity's sake, the following description simply uses the phrases "detect voltage VB of battery pack 10" and "detect temperature TB of battery pack 10". Similarly, as to the SOC and the OCV, the explanation will be made with battery pack 10 as a unit of estimation.

PCU 30 performs two-way power conversion between battery pack 10 and motor generators 61, 62 in accordance with a control signal from ECU 100. PCU 30 is configured to control the states of motor generators 61, 62 independently of each other. For example, while motor generator 61 is in a regenerative state (power generation state), motor generator 62 is in a powering state. PCU 30 includes, for example, two inverters (not shown) corresponding to motor generators 61, 62, and a converter (not shown) to raise a DC voltage supplied to each inverter to more than or equal to the output voltage of battery pack 10.

Inlet 40 is configured to connect a charging cable thereto. Through the charging cable, inlet 40 receives electric power from a power source 90 provided outside of vehicle 1. Power source 90 is, for example, a commercial power source.

Charger 50 converts electric power, supplied from power source 90 through the charging cable and inlet 40, into electric power suitable for charging battery pack 10, in accordance with a control signal from ECU 100. Charger 50 includes, for example, an inverter and a converter (which are not shown).

ECU 100 includes a central processing unit (CPU) 100A, a memory (specifically, a read only memory (ROM) and a random access memory (RAM)) 100B, and an input/output port (not shown) for inputting and outputting various types of signals. ECU 100 executes an "SOC estimation process" to estimate the SOC of battery pack 10 based on a signal from each sensor of monitoring unit 20 and based on a program and a map stored in memory 100B. ECU 100 controls charging and discharging of battery pack 10 in accordance with the result of the SOC estimation process. The SOC estimation process is described in detail later. ECU 100 corresponds to a "controller" according to the present disclosure.

FIG. 2 is a diagram for explaining a configuration of each cell 11 in more detail. FIG. 2 shows cell 11 with its inside seen through.

With reference to FIG. 2, cell 11 has a battery case 111 having an angular shape (substantially in the shape of a rectangular parallelepiped). The top of battery case 111 is closed with a lid 112. One end of each of a cathode terminal 113 and an anode terminal 114 protrudes outward from lid 112. The other end of each of cathode terminal 113 and anode terminal 114 is connected to a corresponding one of an internal cathode terminal and an internal anode terminal (which are not shown) in battery case 111. Battery case 111 contains an electrode body 115 therein. Electrode body 115 is formed by stacking a cathode 116 and an anode 117 with a separator 118 lying therebetween and by winding the stack. An electrolytic solution is held by cathode 116, anode 117, separator 118, and the like.

Cathode 116, separator 118, and the electrolytic solution may have any composition and material conventionally known as a composition and material of a cathode, a separator, and an electrolytic solution of a lithium-ion secondary battery. By way of example, cathode 116 may be made of a ternary material, that is, lithium cobalt oxide partially substituted by nickel and manganese. The separator may be made of polyolefin (e.g. polyethylene or polypropylene). The electrolytic solution may contain: an organic solvent (e.g. a mixture of dimethyl carbonate (DMC), ethyl methyl carbonate (EMC), and ethylene carbonate (EC)); a lithium salt (e.g. $LiPF_6$); and an additive (e.g. lithium bis (oxalate) borate (LiBOB) or $Li[PF_2 (C_2O_4)_2]$). Instead of an electrolytic solution, a polymer electrolyte or an inorganic (e.g. oxide or sulfide) solid electrolyte may be used.

The cell may have any structure. For example, the electrode body may have a layered structure, instead of a wound structure. The battery case is not limited to an angular shape but may have a cylindrical or laminated shape.

Conventionally, a carbon material (e.g. graphite) has been typically used as an anode active material for a lithium-ion secondary battery. In the present embodiment, a silicon compound (Si or SiO) is used as an active material for anode 117. Using a silicon compound can increase the energy density and the like of battery pack 10. The system of battery with a silicon compound, however, may exhibit significant hysteresis in the SOC-OCV characteristics (SOC-OCV curve). This is conceivably because of a volume change of the anode active material associated with charging and discharging, as described below.

<Hysteresis of SOC-OCV Curve>

The anode active material expands when lithium is inserted, and contracts when lithium is removed. Such a volume change of the anode active material causes a stress at a surface or inside of the anode active material. A silicon compound changes volume greater than graphite when lithium is inserted or removed. Specifically, relative to the minimum volume with no lithium inserted, graphite changes volume by a factor (expansion coefficient) of 1.1 when lithium is inserted; whereas a silicon compound changes volume by a factor of up to 4. Accordingly, using a silicon compound as the anode active material causes a larger stress at the surface of the anode active material than using graphite. The stress is hereinafter also referred to as a "surface stress".

In general, a single electrode potential (cathode potential or anode potential) is determined by the state of the active material surface, specifically, by the amount of lithium and the surface stress at the active material surface. For example, it is known that an anode potential decreases when the amount of lithium on the surface of the anode active material increases. Using a material that significantly changes volume, such as a silicon compound, causes a large amount of change in surface stress associated with increase and decrease in amount of lithium. The surface stress has hysteresis. By considering the influence of the surface stress and its hysteresis, therefore, the anode potential can be accurately defined. In estimating the SOC from the OCV using the relation between the SOC and the OCV, the SOC can be accurately estimated by factoring a surface stress into an anode potential.

As described above, the OCV refers to a voltage under a state where the voltage of battery pack 10 is relaxed enough and where the lithium concentration in the active material is relaxed. A residual stress at the surface of the anode in such a relaxed state may be construed as a stress of when various forces in the entire system are in balance, the forces including: a stress occurring in the anode active material, and a force counteracting on the anode active material from peripheral materials due to a volume change of the anode active material. The peripheral materials refer to the materials that lie around the active material, such as a binder and a conductive assistant.

Figure 3:
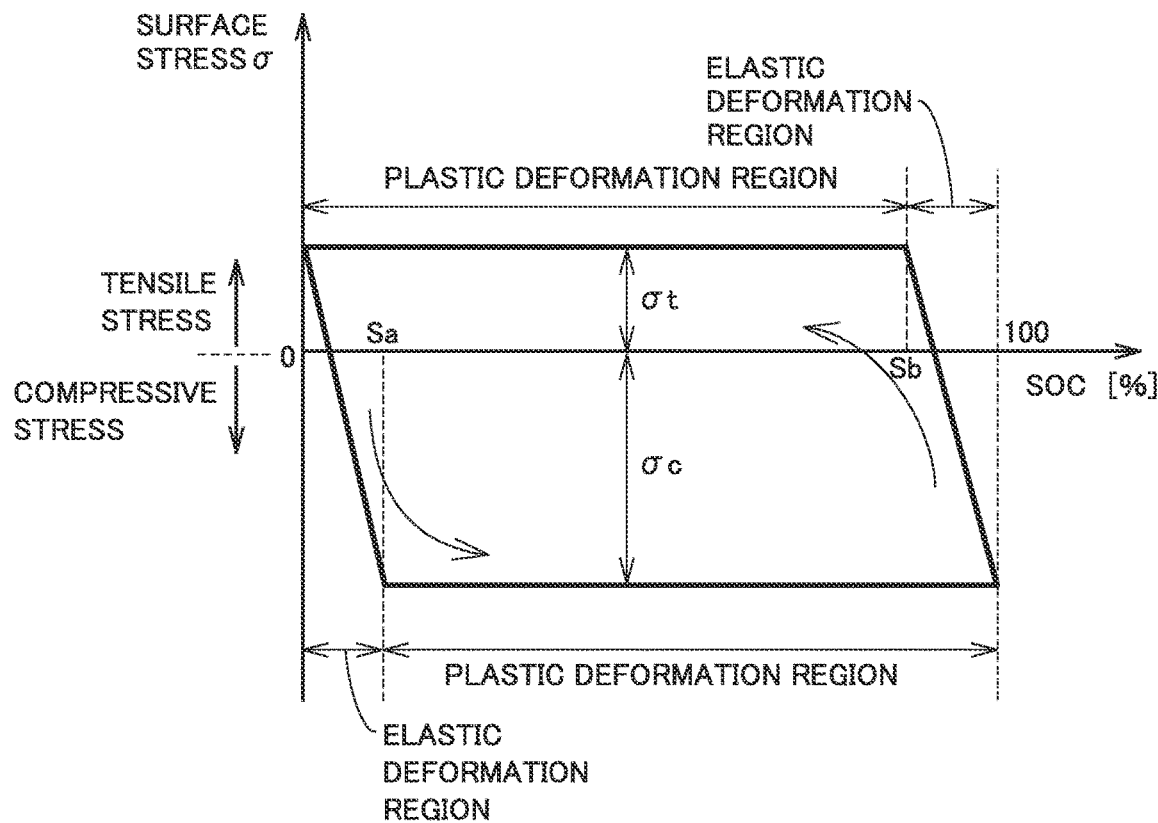
FIG. 3 shows an example of a change in surface stress associated with charging and discharging of a battery pack.

FIG. 3 schematically shows an example of a change in surface stress σ associated with charging and discharging of battery pack 10. In FIG. 3, the horizontal axis represents the SOC of battery pack 10, and the vertical axis represents surface stress σ. As to surface stress σ, a tensile stress occurring during contraction of anode active material 71 (during discharging of battery pack 10) is expressed in the positive direction, whereas a compressive stress occurring during expansion of anode active material 71 (during charging of battery pack 10) is expressed in the negative direction.

FIG. 3 schematically shows an example of a change in surface stress σ of when battery pack 10 is charged at a constant charging rate from the fully discharged state (SOC=0%) to the fully charged state (SOC=100%) and is then discharged at a constant discharging rate from the fully charged state to the fully discharged state.

Immediately after the start of charging from the fully discharged state, surface stress σ (absolute value) linearly increases. In the SOC region during this charging (the region from SOC=0% to SOC=X), the surface of anode active material 71 is supposedly elastically deformed. In the subsequent region (the region from SOC=X to SOC=100%), the surface of anode active material 71 is supposedly plastically deformed beyond its elastic limit. At the time of discharging of battery pack 10, in the region immediately after the start of discharging from the fully charged state (the region from SOC=100% to SOC=Y), the surface of anode active material 71 is supposedly elastically deformed; whereas, in the subsequent region (the region from SOC=Y to SOC=0%), the surface of anode active material 71 is plastically deformed. Although all the changes in surface stress σ are shown by straight lines in FIG. 3, this is merely a schematic representation of changes in surface stress σ. In reality, a non-linear change occurs in the plasticity region after the yield (the SOC region where plastic deformation occurs) (see, for example, "In Situ Measurements of Stress-Potential Coupling in Lithiated Silicon", V. A. Sethuraman et al., Journal of The Electrochemical Society, 157 (11) A1253-A1261 (2010), FIG. 2).

While battery pack 10 is being charged, the surface of the anode active material is mainly subjected to a compressive stress (i.e., surface stress σ is a compressive stress), which reduces the anode potential as compared to the ideal conditions with no surface stress σ. Thus, the OCV of battery pack 10 is increased. While battery pack 10 is being discharged, the surface of the anode active material is mainly subjected to a tensile stress (i.e., surface stress σ is a tensile stress), which increases the anode potential as compared to the ideal conditions. Thus, the OCV of battery pack 10 is decreased. According to such a mechanism, hysteresis associated with charging and discharging appears in the SOC-OCV curve of battery pack 10.

Figure 4:
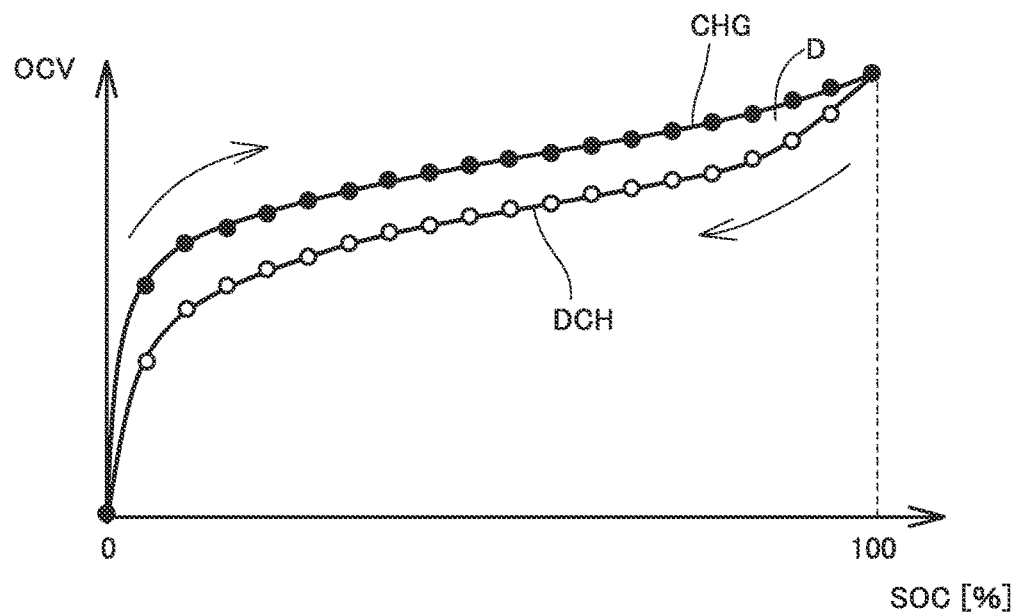
FIG. 4 shows an example of the hysteresis in the SOC-OCV curve of the battery pack in embodiment 1.

FIG. 4 shows an example of the hysteresis in the SOC-OCV curve of battery pack 10 in embodiment 1. In FIG. 4 and later-described FIG. 5A to FIG. 7, the horizontal axis represents the SOC of battery pack 10, and the vertical axis represents the OCV of battery pack 10.

FIG. 4 shows a curve CHG acquired by repeating charging and stopping (stop of charging) from the fully discharged state of battery pack 10, and a curve DCH acquired by repeating discharging and stopping (stop of discharging) after the fully charged state of battery pack 10. Hereinafter, an OCV on curve CHG is referred to as a "charging OCV", and an OCV on curve DCH is referred to as a "discharging OCV". The gap between the charging OCV and the discharging OCV (about 150 mV for a silicon compound) represents hysteresis.

The charging OCV can be acquired as follows. First, battery pack 10 in the fully discharged state is prepared and is charged with an electric quantity (quantity of electric charge) equivalent to a SOC of, for example, 5%. After charging with that electric quantity, the charging is stopped and battery pack 10 is left as it is until polarization due to the charging disappears (e.g. for 30 minutes). After an elapse of the leaving time, the OCV of battery pack 10 is measured. The combination (SOC, OCV) of the SOC after the charging (=5%) and the measured OCV is plotted in the figure.

Then, charging with an electric quantity equivalent to a SOC of subsequent 5% (charging from SOC=5% to SOC=10%) is started. When the charging completes, battery pack 10 is left as it is in the same manner as above. After an elapse of the leaving time, the OCV of battery pack 10 is measured. From the measurement result of the OCV, the combination of the SOC and the OCV is plotted again. The same procedure is repeated until battery pack 10 reaches the fully charged state. By such measurements, the charging OCV is acquired.

Next, discharging and stop of discharging of battery pack 10 are repeated until battery pack 10, starting from the fully charged state, reaches the fully discharged state. The OCV of battery pack 10 is measured for every 5% of the SOC. By such measurements, the discharging OCV is acquired. The acquired charging OCV and discharging OCV are stored in memory 100B of ECU 100.

The charging OCV shows the highest value of the OCV for each SOC, and the discharging OCV shows the lowest value of the OCV for each SOC. Therefore, in the SOC-OCV characteristic diagram, the state of battery pack 10 (i.e., a combination of the SOC and the OCV) is plotted on the charging OCV, on the discharging OCV, or in a region D enclosed by the charging OCV and the discharging OCV. The perimeter of region D corresponds to the perimeter of the parallelogram schematically shown in FIG. 3.

Depending on the history of use of battery pack 10, a state P of battery pack 10 (a combination of the OCV and the SOC) may be or may not be plotted on the charging OCV or discharging OCV. In other words, in some cases the SOC of battery pack 10 can be estimated from the OCV by referring to the charging OCV or the discharging OCV; whereas in other cases the SOC cannot be accurately estimated merely by referring to the charging OCV or the discharging OCV. This suggests that a method for estimating the SOC should be selected (or switched) as appropriate in accordance with the history of use of battery pack 10. If a criterion for such selection (a criterion for the history of use of battery pack 10) is not clearly defined, the SOC may not be estimated accurately enough.

In the present embodiment, EUC 100 is configured to select any one of a plurality of estimation processes (first to third estimation processes described later). As described hereinafter, the accuracy in SOC estimation improves by selecting an appropriate estimation process in accordance with the history of use of battery pack 10.

<Flag Management>

ECU 100 manages a flag F to be used to select one of the first to third estimation processes. Flag F has a value of any of 1 to 3 and is stored in nonvolatile memory 100B in ECU 100.

Figure 5A:
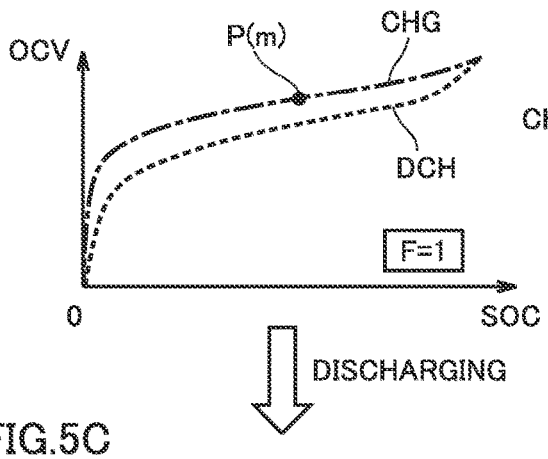
FIG. 5A is a first diagram for explaining the outline of first to third estimation processes.

FIG. 5A to FIG. 5E explain the outline of the first to third estimation processes. The state of battery pack 10 (a combination of the OCV and the SOC) determined by the SOC estimation process at the ITO (m is a natural number) arithmetic cycle is denoted by "P(m)". FIG. 5A shows an example where battery pack 10 is charged (for example, "external charge" via inlet 40) and state P(m) of battery pack 10 is plotted on the charging OCV.

Figure 5B:
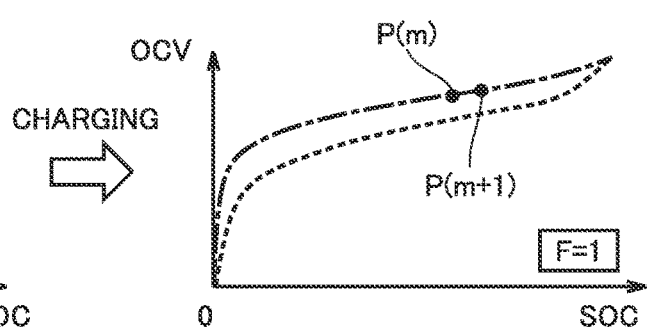
FIG. 5B is a second diagram for explaining the outline of first to third estimation processes.

When charging of battery pack 10 is continued from state P(m), state P(m+1) at the $(m+1)^{th}$ arithmetic cycle is maintained on the charging OCV as shown in FIG. 5B. When battery pack 10 is further charged from state P on the charging OCV as in this case, flag F is set to F=1. With F=1, a first estimation process (see FIG. 13) is executed.

Figure 5C:
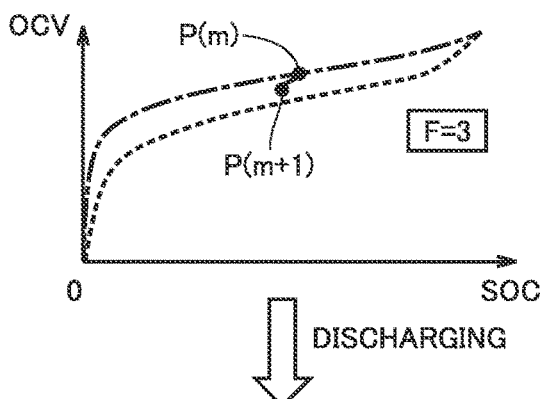
FIG. 5C is a third diagram for explaining the outline of first to third estimation processes.
Figure 5D:
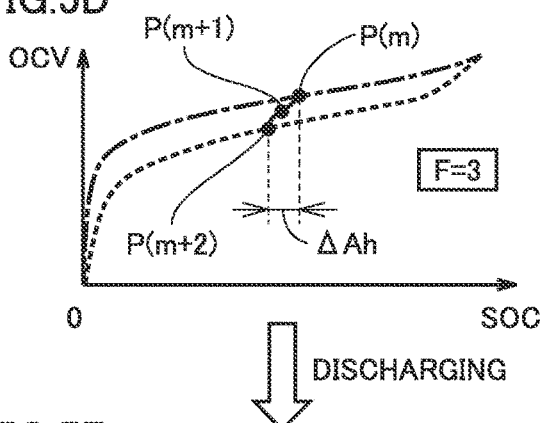
FIG. 5D is a fourth diagram for explaining the outline of first to third estimation processes.
Figure 5E:
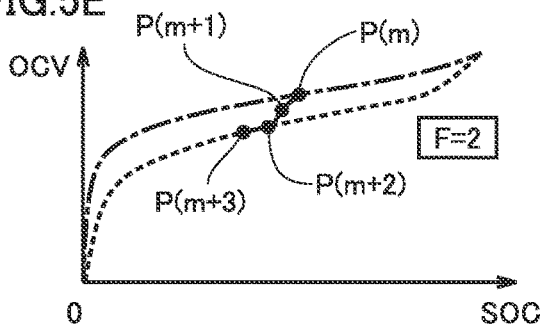
FIG. 5E is a fifth diagram for explaining the outline of first to third estimation processes.

When battery pack 10 is discharged from state P(m) shown in FIG. 5A, state P(m+1) at the $(m+1)^{th}$ arithmetic cycle deviates from the charging OCV to be plotted between the charging OCV and the discharging OCV, as shown in FIG. 5C. When battery pack 10 is charged or discharged from state P plotted between the charging OCV and the discharging OCV (i.e., in region D), flag F is set to F=3. In this case, a third estimation process (see FIG. 15) is executed.

After subsequent continuation of discharging of battery pack 10, state P(m+2) reaches the discharging OCV at the $(m+2)^{th}$ arithmetic cycle (see FIG. 5D), for example. When battery pack 10 is further discharged from state P on the discharging OCV, flag F is set to F=2. In this case, a second estimation process (see FIG. 14) is executed.

<Selection from First to Third Estimation Processes>

How to select an appropriate estimation process from among the first to third estimation processes in embodiment 1 will now be described in more detail with reference to FIG. 6A to FIG. 6C and FIG. 7.

Figure 6A:
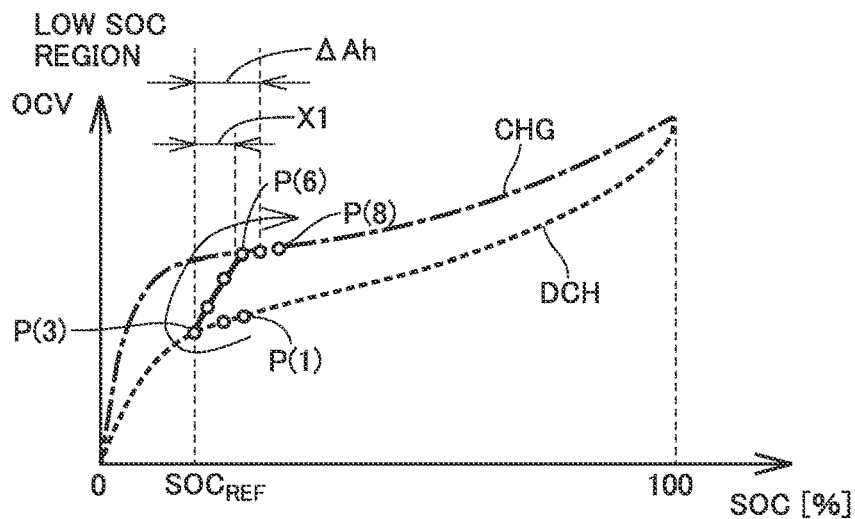
FIG. 6A is a conceptual diagram for explaining a method for selecting an estimation process for a low SOC region.
Figure 6B:
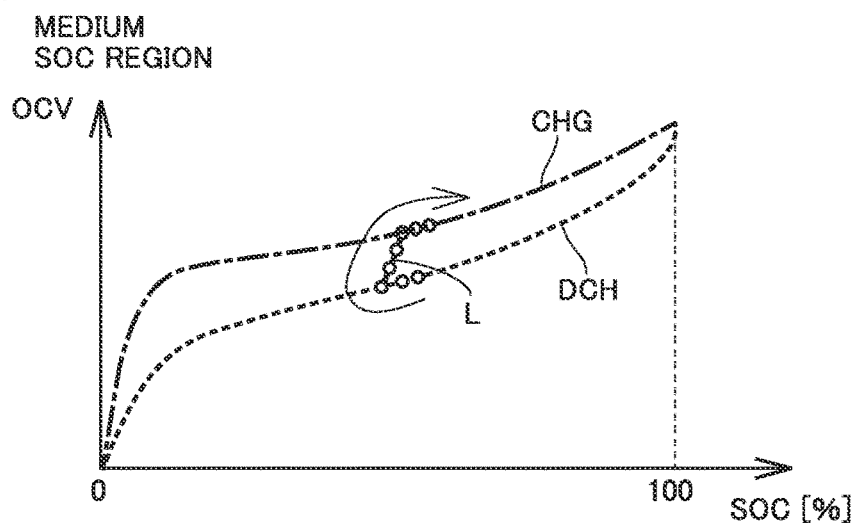
FIG. 6B is a conceptual diagram for explaining a method for selecting an estimation process for a medium SOC region.
Figure 6C:
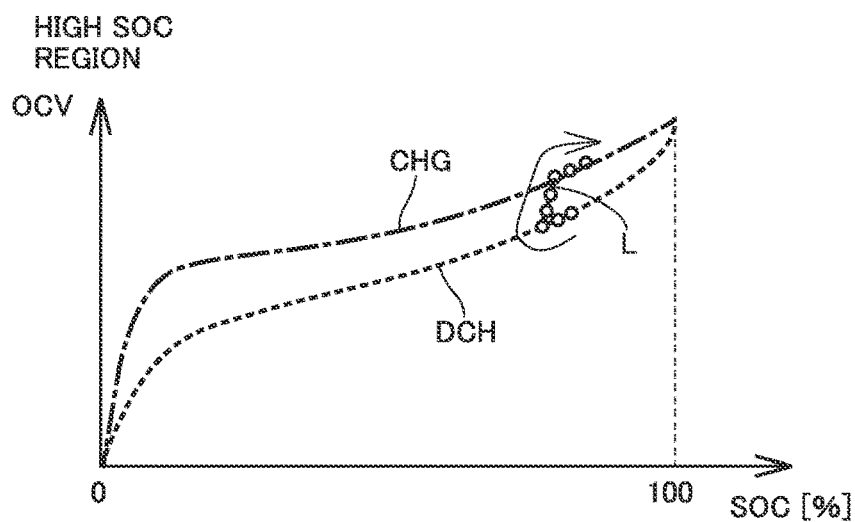
FIG. 6C is a conceptual diagram for explaining a method for selecting an estimation process for a high SOC region.

FIG. 6A to FIG. 6C are conceptual diagrams for explaining a method for selecting an estimation process. FIG. 6A shows a case in which battery pack 10 is charged and discharged in the order of states denoted by P(1) to P(8) (see the arrow in FIG. 6A). Specifically, first, battery pack 10 in state P(1) is discharged until state P(3). Then, at state P(3), battery pack 10 is switched from discharging to charging. From then on, battery pack 10 is charged until state P(8). FIG. 6A shows the marks of only P(1), P(3), P(6), and P(8) in order to avoid complication of the figure.

As described in FIG. 5A to FIG. 5E, when battery pack 10 is further discharged from state P(1) on the discharging OCV, state P of the battery pack is maintained on the discharging OCV (see states P(2) and P(3)). Accordingly, flag F is set to F=2 for execution of the second estimation process, and the SOC can be estimated by referring to the discharging OCV. Similarly, when battery pack 10 is further charged from state P(6) on the charging OCV, state P of the battery pack is maintained on the charging OCV (see states P(7) and P(8)). Accordingly, flag F is set to F=1 for execution of the first estimation process, and the SOC can be estimated by referring to the charging OCV.

The SOC estimation between states P(3) to P(6), however, has the following two problems. The first problem is how to determine that state P of battery pack 10 has reached the charging OCV (see state P(6)). The second problem is how to estimate the SOC if state P of battery pack 10 is plotted neither on the charging OCV nor on the discharging OCV (see states P(4) and P(5)).

The present inventor found the following behavior of battery pack 10 by experiment. As to the first problem, the present inventor measured an electric quantity ΔAh charged to battery pack 10 since switching from discharging to charging (see state P(3)). As a result, it was found that, with electric quantity ΔAh being less than a predetermined quantity, state P of battery pack 10 may not have reached the charging OCV; whereas, with electric quantity ΔAh being more than or equal to the predetermined quantity, state P can be regarded as having reached the charging OCV even if the charging started from the discharging OCV. The phrase "can be regarded as having reached" may include not only the case in which state P has fully reached the charging OCV, but also the case in which the difference between the OCV of state P and the charging OCV is less than a certain value, that is, in which the state can be approximated by "having reached". The predetermined quantity (hereinafter referred to as a "reference charging quantity X1") can be set based on experiment results as follows.

First, for the SOC of battery pack 10 in a low SOC region (the region where the SOC is about 20%) as shown in FIG. 6A, electric quantity ΔAh (the predetermined quantity described above) required for state P to reach the charging OCV is obtained. Similarly, for the SOC of battery pack 10 in a medium SOC region (the region where the SOC is about 50%) (see FIG. 6B), electric quantity ΔAh required for state P to reach the charging OCV is obtained by experiment. Ditto for the SOC of battery pack 10 in a high SOC region (the region where the SOC is about 80%) as shown in FIG. 6C.

Thus, electric quantity ΔAh required for state P to reach the charging OCV was experimentally obtained for various SOC regions. As a result, electric quantity ΔAh was proved to be equivalent to about several percent of the SOC of battery pack 10 and substantially constant regardless of the SOC region. Electric quantity ΔAh obtained in this way can be set as reference charging quantity X1. Accordingly, a common value can be used as reference charging quantity X1 regardless of the SOC.

It is preferable, however, that the maximum value in all the SOC regions be set as reference charging quantity X1 because electric quantity ΔAh may be slightly different depending on the SOC region. Alternatively, the relation between the SOC at the time of switching between charging and discharging and reference charging quantity X1 may be stored in memory 100B of ECU 100 as a map.

In this way, whether state P has reached or may not have reached the charging OCV can be determined by setting reference charging quantity X1 based on experiment results and by comparing electric quantity ΔAh with reference charging quantity X1, the electric quantity ΔAh being a quantity of electricity that has charged battery pack 10, without being discharged, since switching from discharging to charging.

As to the second problem, experiments conducted by the present inventor show that, when state P of battery pack 10 is plotted neither on the charging OCV nor on the discharging OCV, the relation between the change amount of OCV and the change amount of SOC can be linearly approximated. Specifically, between the OCV change amount ΔOCV (hysteresis) and the SOC change amount ΔSOC since switching from discharging to charging, the approximation expressed by the following equation (1) with a constant of proportionality α is satisfied.

$$\Delta OCV = \alpha \times \Delta SOC \qquad (1)$$

The reason for such linearity will now be described. The surface of anode active material 71 is supposedly elastically deformed immediately after switching between charging and discharging, as described in FIG. 3. In general, Hooke's law holds in the elastic deformation region of material, where deformation is in direct proportion to stress. A linear relation also holds between OCV change amount ΔOCV and surface stress σ. Specifically, the linear relation is expressed as the following equation (2).

$$\Delta OCV = k \times \Omega \sigma / F \qquad (2)$$

In equation (2), Ω (unit: m³/mol) denotes the amount of volume increase of anode active material 71 with 1 mol of lithium inserted, F (unit: C/mol) denotes Faraday constant, and k denotes a constant experimentally obtained. The above linear relation enables easy execution of the third estimation process.

Figure 7:
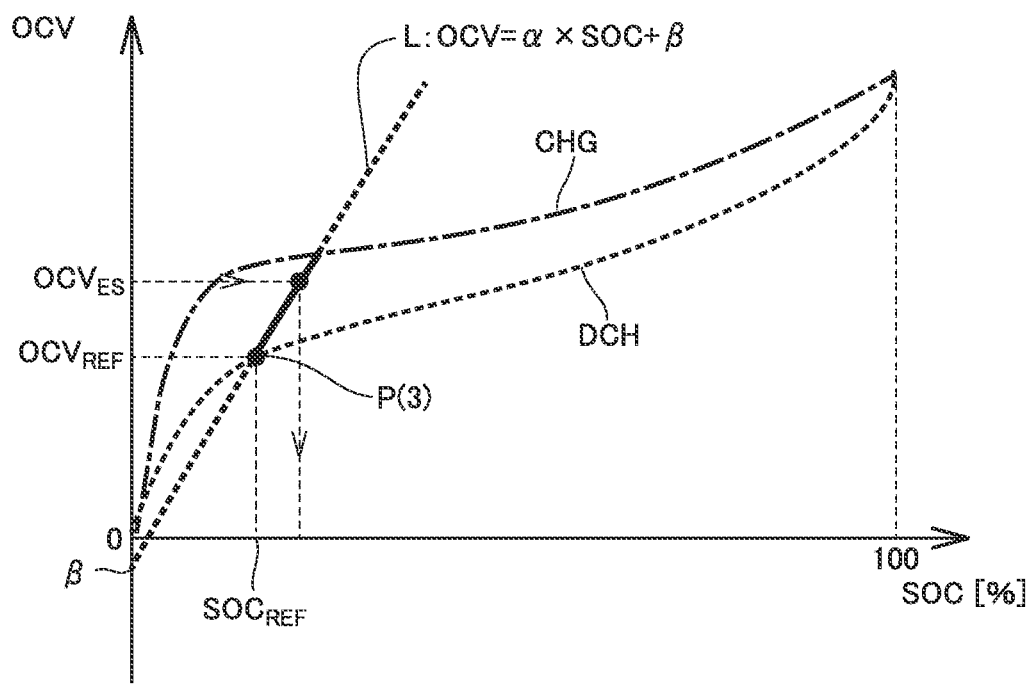
FIG. 7 is a diagram for explaining the third estimation process in more detail.

FIG. 7 is a diagram for explaining the third estimation process in more detail. As shown in FIG. 7, state P of battery pack 10, when neither on the charging OCV nor on the discharging OCV, is plotted on a straight line L in region D. The constant of proportionality (gradient) of straight line L is denoted by a.

Constant of proportionality α, which is a parameter that depends on the mechanical characteristics of anode active material 71 (and a peripheral member 72), is obtained by experiment. Specifically, constant of proportionality α may change depending on the temperature of anode active material 71 temperature TB of battery pack 10) and the lithium content in anode active material 71 (in other words, the SOC of battery pack 10). It is preferable that constant of proportionality α be obtained for each of various combinations of temperatures TB and SOCs of battery pack 10 to prepare a map MP.

Figure 8:
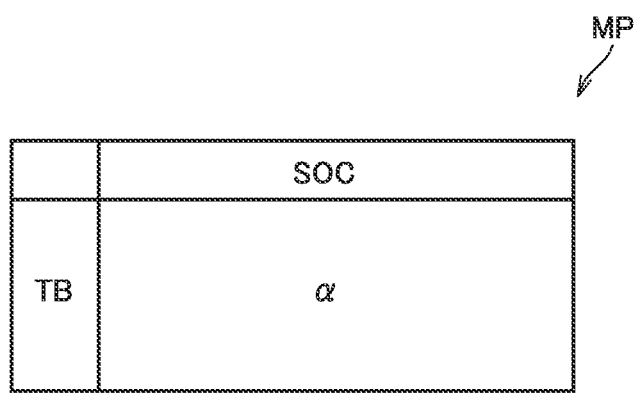
FIG. 8 shows an example of a map for calculating a constant of proportionality.

FIG. 8 shows an example of map MP for calculating constant of proportionality α. Map MP as shown in FIG. 8 is prepared and stored in memory 100B of ECU 100 in advance. By referring to map MP, constant of proportionality α can be calculated from temperature TB of battery pack 10 (the value acquired by temperature sensor 23) and the SOC (the result of SOC estimation at the last arithmetic cycle). Map MP corresponds to the "correlation" according to the present disclosure.

Map MP may show a correlation between only one of temperature TB and the SOC, and constant of proportionality α. Although the example shown in FIG. 8 uses map MP, physical property values (e.g. Young's modulus) of anode active material 71 and peripheral member 72 may be used to determine (or predict by simulation) constant of proportionality α. A reference $SOC_{REF}$ may be used to calculate constant of proportionality α. A fixed value may be used as constant of proportionality α.

Referring back to FIG. 7, the SOC and the OCV at state P(3), where charging/discharging of battery pack 10 is switched from discharging to charging, are both estimated by the second estimation process. Accordingly, where the SOC at state P(3) and the OCV at state P(3) are respectively denoted by "reference $SOC_{REF}$" and "reference $OCV_{REF}$", the SOC can be estimated by substituting constant of proportionality α, reference $SOC_{REF}$, and reference $OCV_{REF}$ into the following equation (3) and substituting an estimated OCV (estimated $OCV_{ES}$ described later) of battery pack 10 into equation (3).

$$\alpha=(OCV_{ES}-OCV_{REF})/(SOC-SOC_{REF}) \quad (3)$$

In this way, constant of proportionality $\alpha$ of straight line L can be obtained using map MP. By substituting reference $SOC_{REF}$, reference $OCV_{REF}$, and estimated $OCV_{ES}$ into equation (3) holding true for constant of proportionality $\alpha$, the SOC of battery pack 10 can be estimated.

Although FIG. 6A to FIG. 6C and FIG. 7 specify charging/discharging for states P(1) to P(8) of battery pack 10, it is merely by way of example. The SOC of battery pack 10 can be estimated in the same way as described in FIG. 6A to FIG. 6C and FIG. 7 regardless of charging/discharging of battery pack 10, although the detailed explanation is not repeated.

<Process Flow of SOC Estimation Process>

Figure 9:
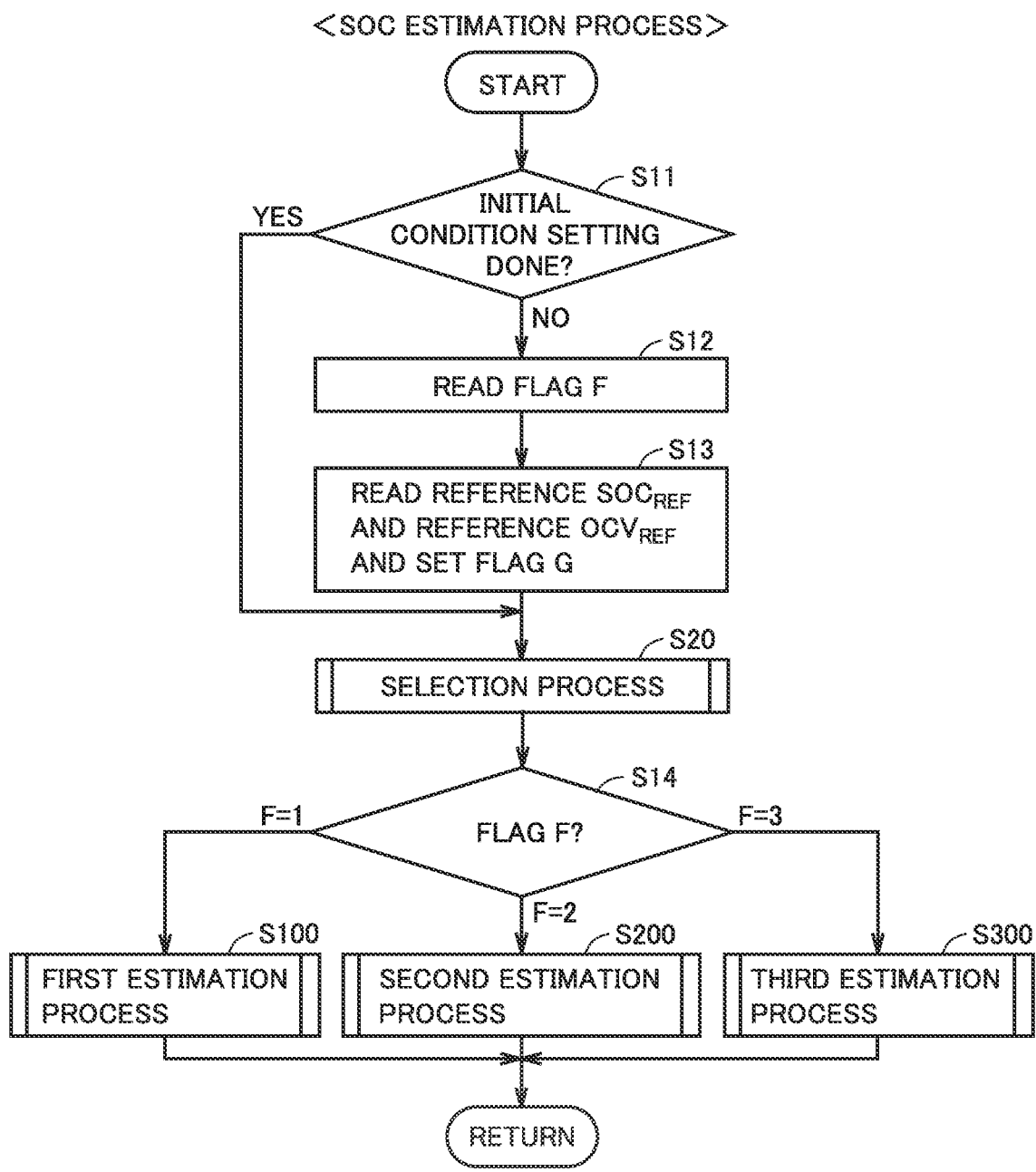
FIG. 9 is a flowchart for explaining the SOC estimation process in embodiment 1.

FIG. 9 is a flowchart for explaining the SOC estimation process in embodiment 1. The flowcharts shown in FIG. 9 and later-described FIG. 16 are invoked from a main routine (not shown) each time a predetermined arithmetic cycle has elapsed, and are repeatedly executed by ECU 100, for example. The current arithmetic cycle is denoted by the $n^{th}$ (n is a natural number of 2 or more) arithmetic cycle. A parameter of the current arithmetic cycle is denoted with n, and a parameter of the last arithmetic cycle is denoted with (n−1) to distinguish them from each other.

The steps (hereinafter abbreviated to "S") included in the flowcharts shown in FIG. 9 to FIG. 16 are basically implemented by software processing by ECU 100. The steps, however, may be implemented by dedicated hardware (electric circuit) provided in ECU 100. Memory 100B of ECU 100 stores reference $SOC_{REF}$ and reference $OCV_{REF}$ as well as flag F obtained at the last arithmetic cycle.

Memory 100B also stores a flag G different from flag F. Flag G is used to manage the relation between the combination (reference point) of reference $SOC_{REF}$ and reference $OCV_{REF}$, and the charging OCV or the discharging OCV. When the reference point is on the charging OCV (charging curve CHG), flag G is set to G=1. When the reference point is on the discharging OCV (discharging curve DCH), flag G is set to G=2.

With reference to FIG. 1 and FIG. 9, in S11, ECU 100 determines whether or not the initial conditions for estimating the SOC of battery pack 10 have already been set. For example, immediately after an operation for turning on the ignition of vehicle 1 (IG-ON), the initial conditions have not been set (NO in S11). Accordingly, ECU 100 moves the process to S12 and reads flag F stored in memory 100B. ECU 100 further reads reference $SOC_{REF}$ and reference $OCV_{REF}$ from memory 100B and sets flag G based on reference $SOC_{REF}$ and reference $OCV_{REF}$ (S13). After that, ECU 100 moves the process to S14. At the time of the second and subsequent execution of a series of processes shown in FIG. 9, ECU 100 determines that the initial conditions have already been set (YES in S11) and skips the processes of S12 and S13.

In S20, ECU 100 executes a selection process for selecting flag F to be used for estimating the SOC. The selection process will be described later in detail with reference to FIG. 10.

In S14, ECU 100 determines the value of flag F selected by the selection process. As described above, with flag F=1, ECU 100 executes the first estimation process (S100). With flag F=2, ECU 100 executes the second estimation process (S200). With flag F=3, ECU 100 executes the third estimation process (S300). After that, ECU 100 returns the process to the main routine.

Figure 10:
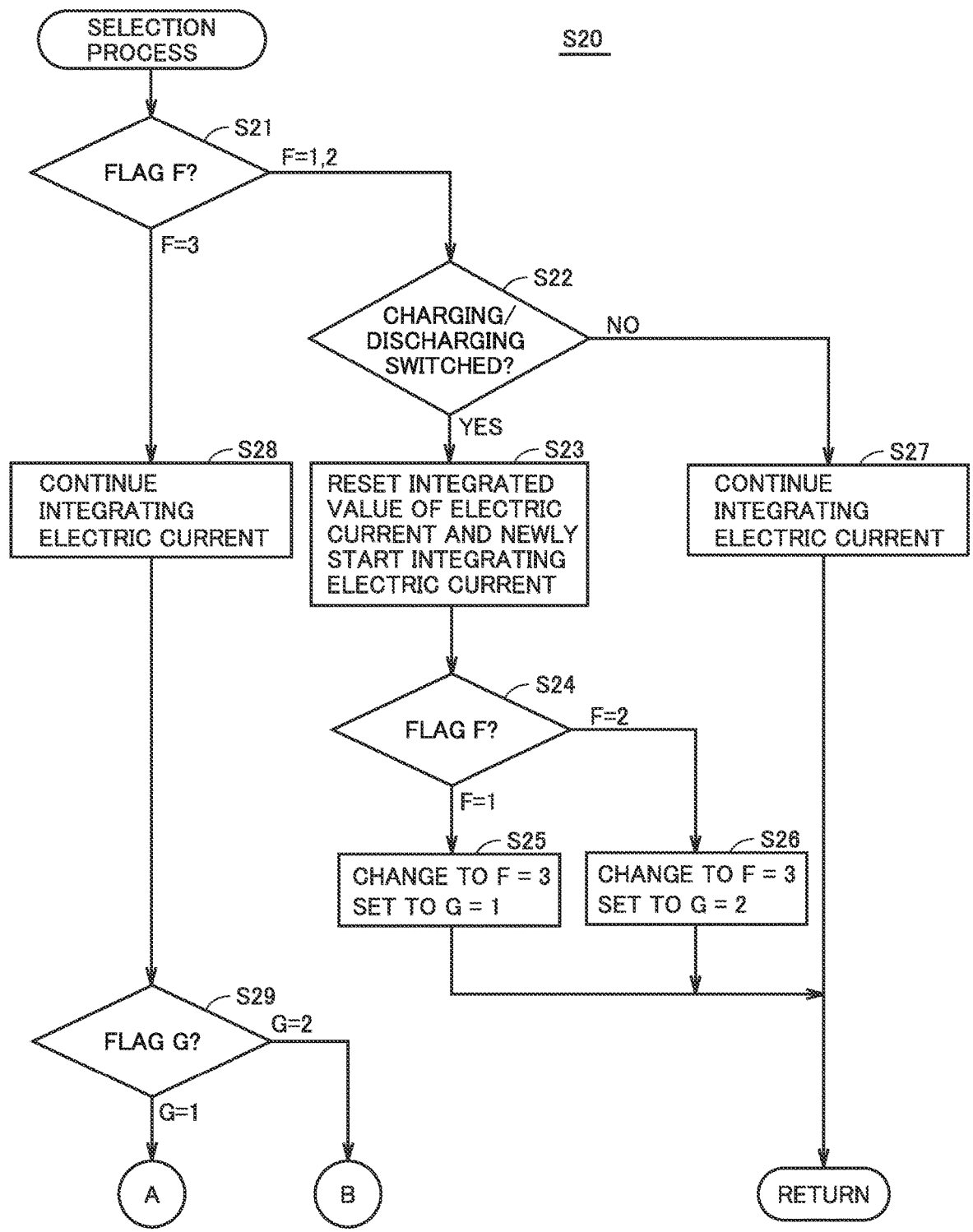
FIG. 10 is a flowchart showing a selection process.

FIG. 10 is a flowchart showing the selection process. In the foregoing description in connection with FIG. 6A to FIG. 6C, "ΔAh" denotes an electric quantity charged to battery pack 10 since switching from discharging to charging when the reference point (the combination of reference $SOC_{REF}$ and reference $OCV_{REF}$) exists on the discharging OCV, by way of example. In the following description, "ΔAh" denotes both an electric quantity charged to battery pack 10 and an electric quantity discharged from battery pack 10, with the reference point that exists on the charging OCV or on the discharging OCV serving as a reference. If the charging quantity for battery pack 10 is larger than the discharging quantity, ΔAh>0 holds. If the discharging quantity from the battery pack 10 is larger than the charging quantity, ΔAh<0 holds. If the charging quantity for the battery pack 10 is equal to the discharging quantity (or battery pack 10 has been neither charged nor discharged), ΔAh=0 holds.

With reference to FIG. 1 and FIG. 10, in S21, ECU 100 determines flag F obtained at the last arithmetic cycle. If flag F obtained at the last arithmetic cycle is 1 or 2 (F=1, 2 in S21), ECU 100 determines whether or not switching between charging and discharging of battery pack 10 has been performed (S22). Specifically, ECU 100 acquires electric current IB from electric current sensor 22, and compares the plus/minus sign of electric current IB of the current arithmetic cycle with the plus/minus sign of electric current IB of the last arithmetic cycle (stored in memory 100B). If the two plus/minus signs are different from each other, ECU 100 determines that switching between charging and discharging of battery pack 10 has been performed; whereas, if the two plus/minus signs are equal to each other, ECU 100 determines that switching between charging and discharging of battery pack 10 has not been performed.

If switching between charging and discharging of battery pack 10 has been performed (YES in S22), ECU 100 resets the integrated value of electric current for calculating electric quantity ΔAh and newly starts integrating the electric current (S23).

After that, ECU 100 moves the process to S24 and determines flag F again. If flag F is 1 (F=1 in S24), state P of battery pack 10 deviates from the charging OCV to be plotted in region D between the charging OCV and the discharging OCV, as described in FIG. 5A to FIG. 5E, in response to switching between charging and discharging of battery pack 10 (in this case, switching from charging to discharging). In this case, ECU 100 changes flag F to F=3. As to flag G, ECU 100 sets it to G=1 which indicates that the reference point exists on the charging OCV (S25).

If flag F is 2 (F=2 in S24), state P of battery pack 10 deviates from the discharging OCV to be plotted in region D between the charging OCV and the discharging OCV, in response to switching between charging and discharging of battery pack 10 (in this case, switching from discharging to charging). In this case, ECU 100 changes flag F to F=3 and sets flag G to G=2 which indicates that the reference point exists on the charging OCV (S26). After that, ECU 100 moves the process to S14 (see FIG. 9).

If switching between charging and discharging of battery pack 10 has not been performed at S22 (NO in S22), ECU 100 continues integrating the electric current (S27). After that, ECU 100 moves the process to S14. In this case, the value (1 or 2) of flag F obtained at the last arithmetic cycle is maintained for the current arithmetic cycle.

Figure 11A:
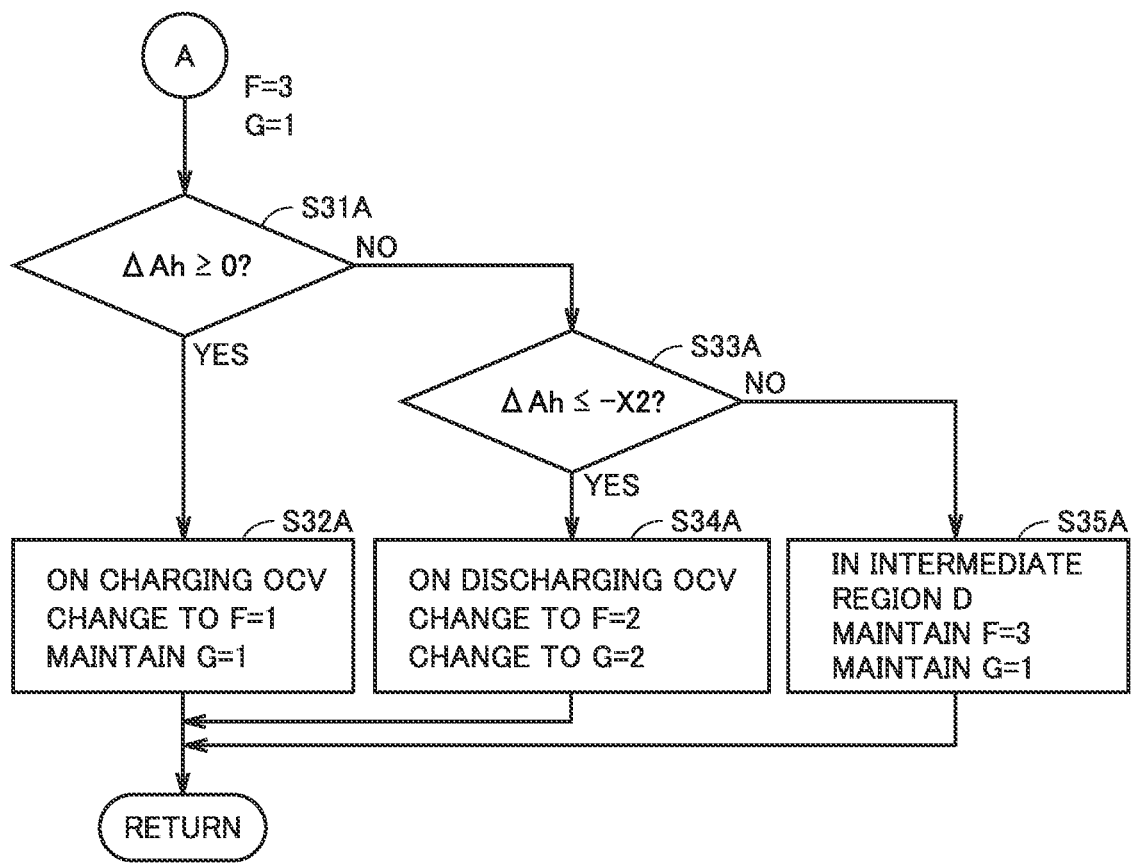
FIG. 11A is a first diagram for explaining a process with a flag G being G=1.
Figure 11B:
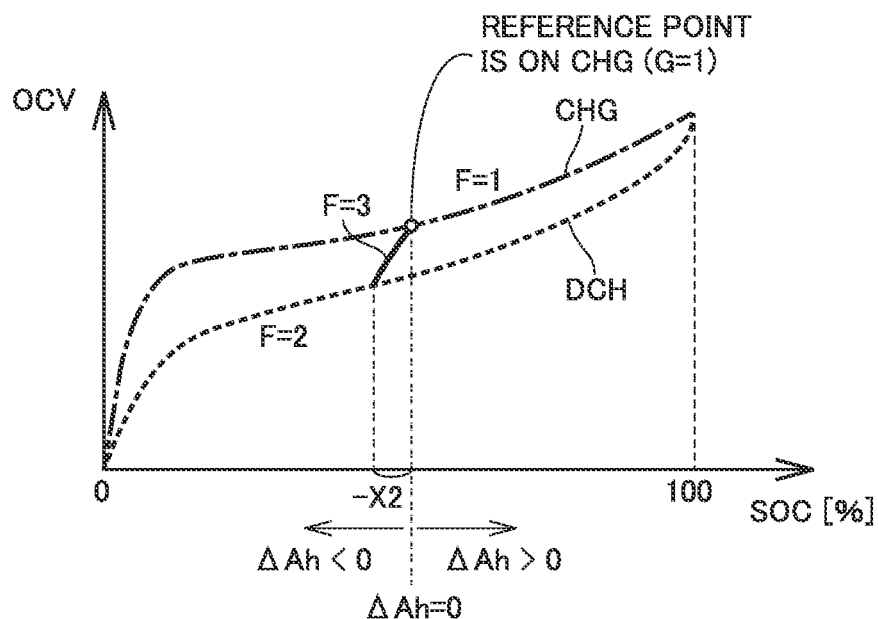
FIG. 11B is a second diagram for explaining a process with flag G being G=1.

If flag F is 3 at S21 (F=3 in S21), ECU 100 continues integrating the electric current (S28) and determines whether flag G is 1 or 2 (S29). If flag G is 1 (G=1 in S29), ECU 100 moves the process to the flowchart shown in FIG. 11A. If flag G is 2 (G=2 in S29), ECU 100 moves the process to the flowchart shown in FIG. 12A. FIG. 11A and FIG. 11B are diagrams for explaining a process with flag G being G=1 (F=3). FIG. 11A shows a flowchart, and FIG. 11B shows a SOC-OCV characteristic diagram corresponding to the flowchart. Ditto for FIG. 12A and FIG. 12B.

With reference to FIG. 11A, in S31A, ECU 100 determines whether or not electric quantity ΔAh calculated by integrating the electric current is 0 or more. If electric quantity ΔAh can be regarded as 0 or more (YES in S31A), ECU 100 determines that state P of battery pack 10 is on the charging OCV and changes flag F to F=1 (see S32A and the region of ΔAh≥0 in FIG. 11B). ECU 100 maintains flag G at G=1.

If electric quantity ΔAh can be regarded as less than 0, that is, if electric quantity ΔAh is negative, (NO in S31A), ECU 100 further determines whether or not electric quantity ΔAh is less than or equal to a predetermined reference discharging quantity −X2 (S33A). Reference discharging quantity −X2 is experimentally determined, as with reference charging quantity X1. Reference discharging quantity −X2 may be an electric quantity equivalent to several percent of the SOC, as with reference charging quantity X1 (with an opposite plus/minus sign), or may be an electric quantity different from it. Note that X2>0 holds.

If electric quantity ΔAh can be regarded as less than or equal to reference discharging quantity −X2 (YES in S33A), ECU 100 determines that state P of battery pack 10 has reached the discharging OCV by being discharged, and thus changes flag F to F=2 (see S34A and the region of ΔAh≤−X2 in FIG. 11B). ECU 100 changes flag G to G=2.

If electric quantity ΔAh can be regarded as more than reference discharging quantity −X2 in S33A (NO in S33A), ECU 100 determines that state P of battery pack 10 is nether on the charging OCV nor on the discharging OCV, that is, in region D (see S35A and the region of −X2<ΔAh<0 in FIG. 11B). In this case, ECU 100 maintains flag F at F=3. ECU 100 maintains flag G at G=1. If each of flags F and G is set to any of 1 to 3, ECU 100 moves the process to S14 (see FIG. 9).

Figure 12A:
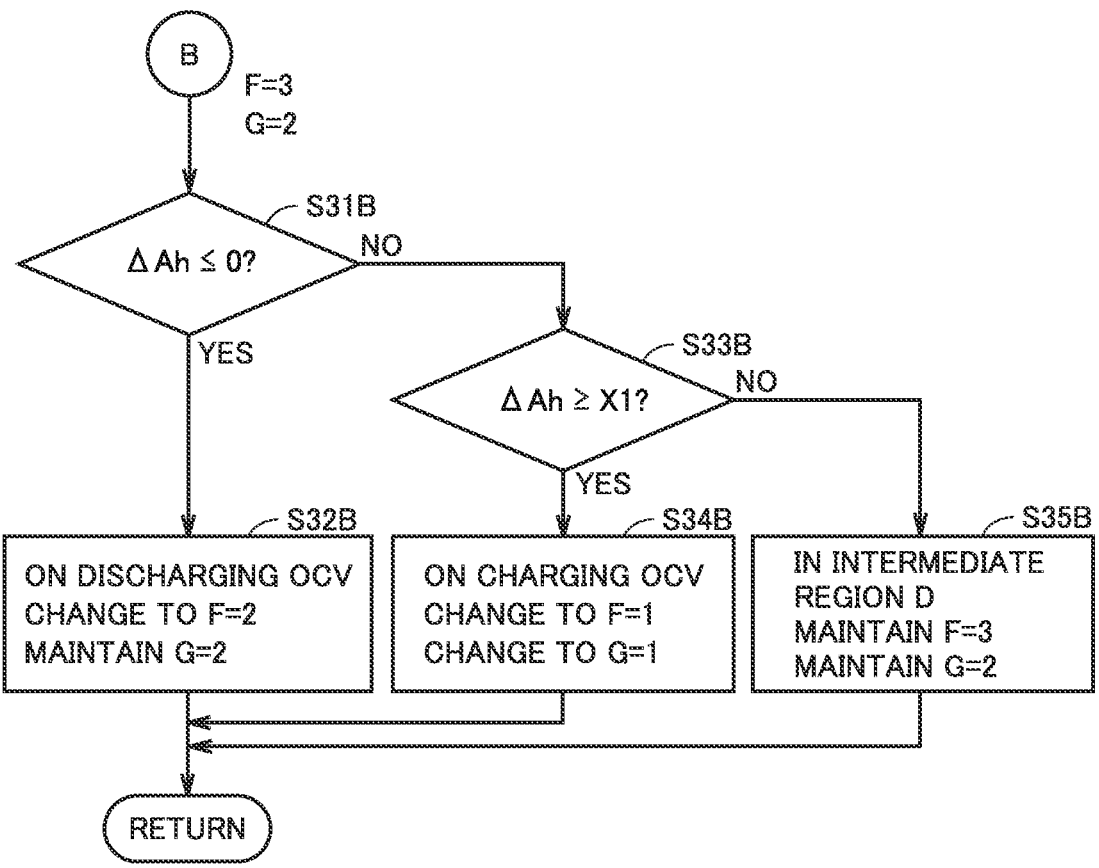
FIG. 12A is a first diagram for explaining a process with flag G being G=2.
Figure 12B:
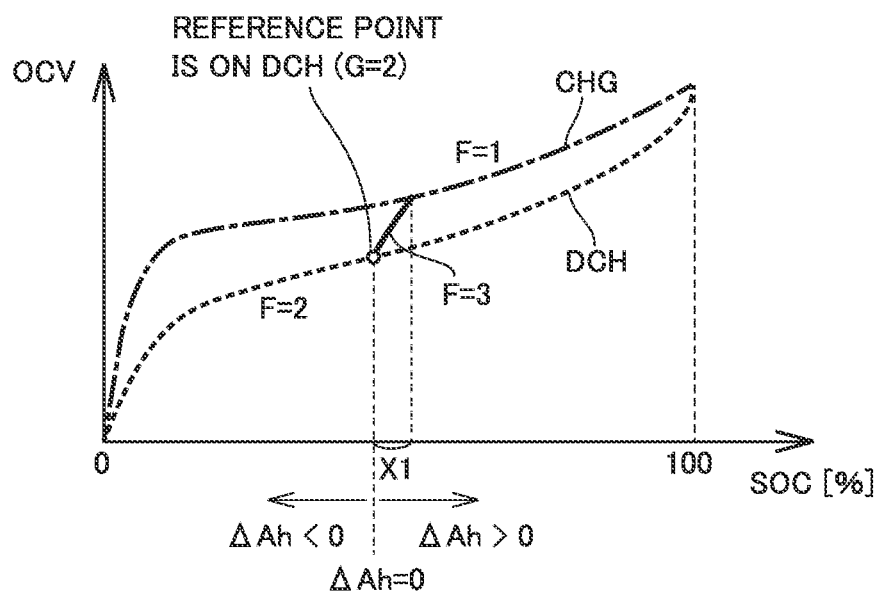
FIG. 12B is a second diagram for explaining a process with flag G being G=2.

FIG. 12A and FIG. 12B are diagrams for explaining a process with flag G being G=2 (F=3). With reference to FIG. 12A, in S31B, ECU 100 determines whether or not electric quantity ΔAh2 calculated by integrating the electric current is 0 or less. If electric quantity ΔAh can be regarded as 0 or less (YES in S31B), ECU 100 determines that state P of battery pack 10 is on the discharging OCV and changes flag F to F=2 (see S32B and the region of ΔAh≤0 in FIG. 12B). ECU 100 maintains flag G at G=2.

If electric quantity ΔAh can be regarded as larger than 0, that is, if electric quantity ΔAh is positive (NO in S31B), ECU 100 further determines whether or not electric quantity ΔAh is equal to or more than reference charging quantity X1 (S33B).

If electric quantity ΔAh can be regarded as equal to or more than reference charging quantity X1 (YES in S33B), ECU 100 determines that state P of battery pack 10 has reached the charging OCV by being charged, and thus changes flag F to F=1 (see S34B and the region of ΔAh≥X1 in FIG. 12B). ECU 100 changes flag G to G=1.

If electric quantity ΔAh can be regarded as less than reference charging quantity X1 in S33B (NO in S33B), ECU 100 determines that state P of battery pack 10 is neither on the charging OCV nor on the discharging OCV and is in region D (see S35B and the region of 0<ΔAh<X1 in FIG. 12B). In this case, ECU 100 maintains flag F at F=3. ECU 100 maintains flag G at G=2.

With the reference point serving as a reference, positive electric quantity ΔAh (charging quantity) corresponds to the "first electric quantity" according to the present disclosure, and negative electric quantity ΔAh (discharging quantity) corresponds to the "second electric quantity" according to the present disclosure. Reference charging quantity X1 and reference discharging quantity X2 respectively correspond to the "first reference electric quantity" and the "second reference electric quantity" according to the present disclosure.

Figure 13:
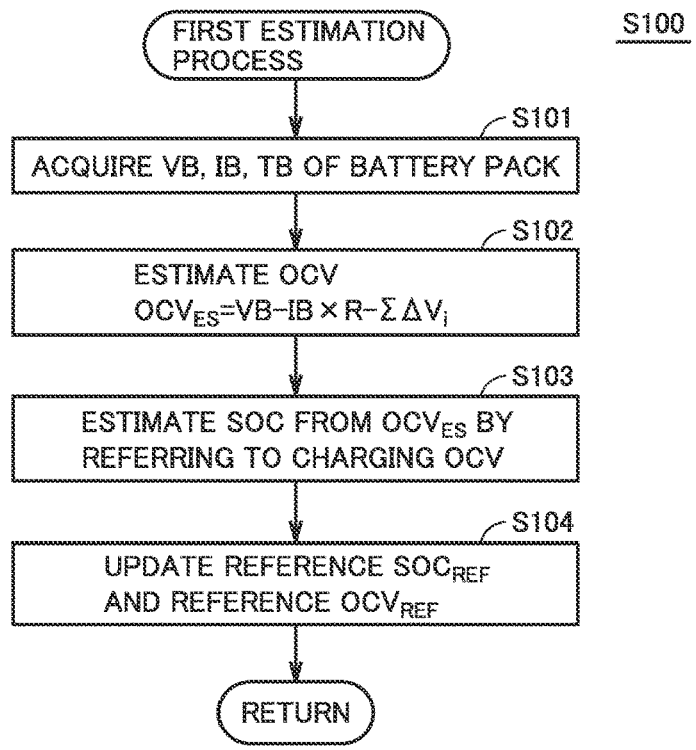
FIG. 13 is a flowchart showing the first estimation process.

FIG. 13 is a flowchart showing the first estimation process. With reference to FIG. 1 and FIG. 13, in S101, ECU 100 acquires voltage VB, electric current IB, and temperature TB of battery pack 10 from the respective sensors (voltage sensor 21, electric current sensor 22, and temperature sensor 23) in monitoring unit 20. The acquired parameters are stored in memory 100B.

In S102, ECU 100 estimates the OCV of battery pack 10 (i.e., acquires estimated $OCV_{ES}$). Estimated $OCV_{ES}$ can be calculated in accordance with the following equation (4). In equation (4), R denotes an internal resistance of battery pack 10, and $\Sigma \Delta V_i$ (i is a natural number) denotes a correction term for correcting the influence of polarization in battery pack 10. This correction term $\Sigma \Delta V_i$ is used to correct polarization caused by lithium diffusion in the cathode and anode active materials and caused by lithium salt diffusion in the electrolytic solution. Consideration of the lithium diffusion in the anode active material preferably includes consideration of the influences of both the lithium concentration difference and the internal stress in the anode active material. Correction term $\Sigma \Delta V_i$ is obtained by preparatory experiment and stored in memory 100B. Correction term $\Sigma \Delta V_i$ is determined so that the value at the time of charging of battery pack 10 is positive.

$$OCV_{ES}=VB-IB\times R-\Sigma\Delta V_i \quad (4)$$

In S103, ECU 100 estimates the SOC from estimated $OCV_{ES}$ by referring to the charging OCV.

In S104, ECU 100 stores the SOC estimated in S103 in memory 100B, as reference $SOC_{REF}$. ECU 100 also stores $OCV_{ES}$ estimated in S102 in memory 100B, as reference $OCV_{REF}$. Thus, reference $SOC_{REF}$ and reference $OCV_{REF}$ are updated in the first estimation process. In this case, flag G is maintained at G=1.

Figure 14:
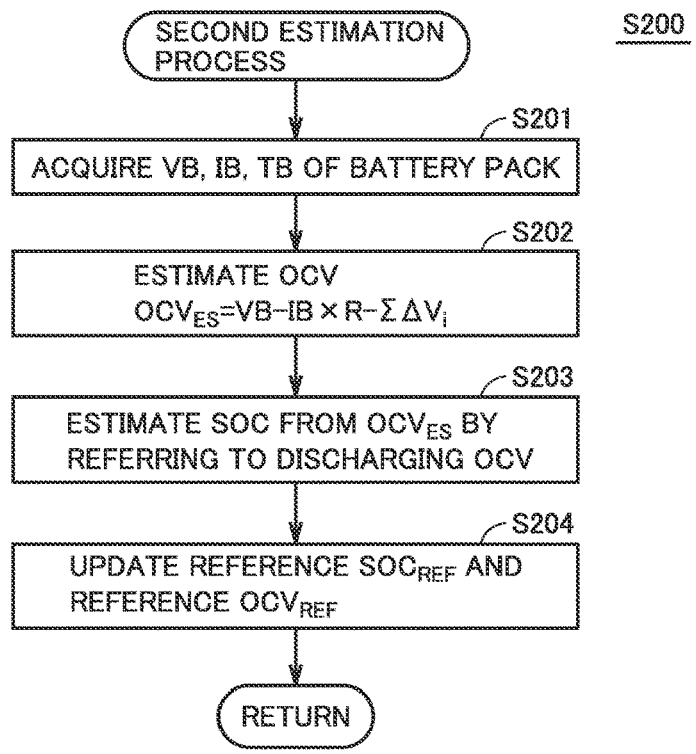
FIG. 14 is a flowchart showing the second estimation process.

FIG. 14 is a flowchart showing the second estimation process. With reference to FIG. 14, the second estimation process is basically the same as the first estimation process except that, in the second estimation process, the discharging OCV is used in the process of S203, instead of the charging OCV, and that flag G is maintained at G=2. Thus, the redundant explanation is not repeated.

Figure 15:
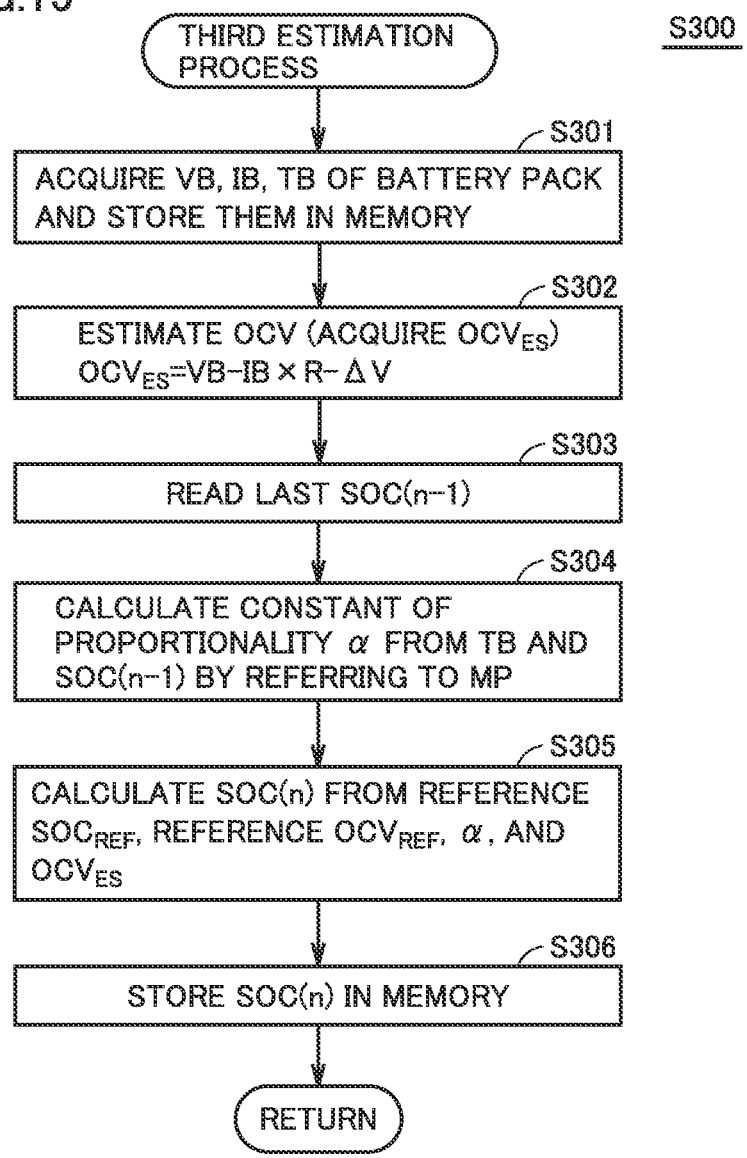
FIG. 15 is a flowchart showing the third estimation process.

FIG. 15 is a flowchart showing the third estimation process. With reference to FIG. 1 and FIG. 15, the processes of S301 and S302 are respectively equivalent to the processes of S101 and S102 of the first estimation process (see FIG. 13).

In S303, ECU 100 reads, from memory 100B, SOC(n−1) calculated at the last arithmetic cycle.

In S304, ECU 100 calculates constant of proportionality α from temperature TB of battery pack 10 and SOC(n−1) of the last arithmetic cycle, by referring to map MP shown in FIG. 8. As temperature TB of battery pack 10, the time average in an immediately preceding predetermined period (e.g. 30 minutes) may be used, instead of directly using temperature TB of the current time. As the SOC obtained by referring to map MP, reference $SOC_{REF}$ may be used.

In S305, ECU 100 substitutes, into the above equation (3), reference $SOC_{REF}$ and reference $OCV_{REF}$ obtained by the first estimation process or the second estimation process, constant of proportionality α set by the process of S304, and estimated $OCV_{ES}$ acquired by the process of S302. Thus, SOC(n) of battery pack 10 of the current arithmetic cycle is calculated. The calculated SOC(n) is stored in memory 100B for the next arithmetic cycle (S306).

As described above, according to embodiment 1, one of the first to third estimation processes is selected for execution by performing the selection process determined based on the findings about the behavior of battery pack 10. This enables selection of an appropriate estimation process according to the history of use (electric quantity ΔAh) of battery pack 10, thus enabling accurate estimation of the SOC from the OCV of battery pack 10. Embodiment 1 is particularly effective for a case in which anode 117 is made of active material (silicon compound) that significantly changes volume in response to charging and discharging and is significantly affected by hysteresis.

The third estimation process uses the linearity related to elastic deformation of anode active material 71 (the linear approximation relation between the SOC and the OCV) to calculate straight line L expressed by equation (3). Using straight line L simplifies the calculation for estimating the SOC, thus reducing the computational load on ECU 100.

During traveling, hybrid vehicle 1 repeats discharging of battery pack 10 for generating a driving force of the vehicle, and charging by regenerative power generation from motor generator 62. Thus, charging/discharging of battery pack 10 is frequently switched. Accordingly, state P of battery pack 10 is likely to deviate from the charging OCV or the discharging OCV to be included in region D. The third estimation process is thus frequently executed, which means that calculation using the linear approximation relation between the OCV and the SOC is particularly useful.

Embodiment 2

Embodiment 1 has described a process for estimating the SOC of battery pack 10. Embodiment 2 describes a process for determining a deterioration condition (State of Health: SOH) of battery pack 10, and more specifically, a process for calculating the full charge capacity of battery pack 10 (full charge capacity calculation process). The secondary battery system according to embodiment 2 is the same in configuration as secondary battery system 2 according to embodiment 1 (see FIG. 1).

FIG. 16 is a flowchart for explaining the full charge capacity calculation process in embodiment 2. With reference to FIG. 1 and FIG. 16, in S401, ECU 100 starts integrating the electric current using electric current sensor 22.

In S402, ECU 100 executes a first-round SOC estimation process (see FIG. 9) as in embodiment 1. The SOC estimated by the first-round SOC estimation process is denoted by S1.

In order to estimate a full charge capacity C accurately, it is preferable that a capacity change amount ΔAh of battery pack 10 (the quantity of electricity that has charged or has been discharged from battery pack 10) between the first-round SOC estimation process and the second-round SOC estimation process be large to some extent. Accordingly, ECU 100 determines whether or not capacity change amount ΔAh is equal to or more than a predetermined quantity (S403). If capacity change amount ΔAh is equal to or more than the predetermined quantity (YES in S403), then ECU 100 determines that the condition for executing the second-round SOC estimation process is satisfied, stops integrating the electric current (S404), and executes the second-round SOC estimation process (S405). The SOC estimated by the second-round SOC estimation process is denoted by S2.

In S406, ECU 100 calculates full charge capacity C of battery pack 10 using S1 and S2, which are the results from the two SOC estimation processes, and using capacity change amount ΔAh. Specifically, full charge capacity C can be calculated in accordance with the following equation (5).

$$C = \Delta Ah/(S1-S2) \times 100 \qquad (5)$$

As described above, the SOC is estimated in accordance with the SOC estimation process described in embodiment 1, and full charge capacity C is calculated using the estimation result. This enables accurate estimation of the SOC, as in embodiment 1, thus also enabling accurate estimation of full charge capacity C. Various types of parameters (constant of proportionality α, reference charging quantity X1, and the like) may be changed as battery pack 10 deteriorates.

FIG. 3 and FIG. 4 describe a case in which a silicon compound is used as an anode active material that significantly changes volume in response to charging and discharging. An anode active material that significantly changes volume in response to charging and discharging, however, is not limited to a silicon compound. The term "an anode active material that significantly changes volume" as used herein refers to a material whose amount of volume change associated with charging and discharging is larger than that of graphite (about 10%). Examples of such anode material for a lithium-ion secondary battery includes tin compounds (e.g. Sn or SnO), germanium (Ge) compounds, and lead (Pb) compounds.

Although a silicon compound is used as an example of anode active material 71, composite material of silicon compound and another material may be used. Examples of such composite material include composite material containing silicon compound and graphite, and composite material containing silicon compound and lithium titanate. If the cathode active material changes volume significantly, hysteresis related to the cathode may be considered.

Further, the "SOC estimation process" according to the present disclosure is applicable not only to a lithium-ion secondary battery but also to another secondary battery (e.g. a nickel hydrogen battery). Since a surface stress may occur also at the cathode of a secondary battery, the "SOC estimation process" according to the present disclosure may be used to consider a surface stress at the cathode of a secondary battery in estimating the SOC.

Although embodiments of the present disclosure have been described, it should be understood that the embodiments disclosed herein are by way of example only in every respect, and are not to be taken by way of limitation. The scope of the present disclosure is defined by the terms of the appended claims and is intended to include any modification within the scope and meaning equivalent to the terms of the claims.

What is claimed is:

1. A secondary battery system comprising:
a secondary battery; and
a controller configured to execute a SOC estimation process for estimating a SOC of the secondary battery from an OCV of the secondary battery using a charging curve and a discharging curve, the charging curve representing SOC-OCV characteristics of the secondary battery charged from a fully discharged state to a fully charged state, the discharging curve representing SOC-OCV characteristics of the secondary battery discharged from the fully charged state to the fully discharged state, the controller comprising a memory that stores the charging curve, the discharging curve, and information of a predetermined correspondence relation for supplementing SOC-OCV characteristics of the secondary battery in a region enclosed by the charging curve and the discharging curve, in the SOC estimation process, the controller being configured to:

calculate a first electric quantity and a second electric quantity, the first electric quantity being an electric quantity charged to the secondary battery since switching from discharging to charging, the second electric quantity being an electric quantity discharged from the secondary battery since switching from charging to discharging;

if the first electric quantity is more than a first reference electric quantity, retrieve the charging curve from the memory, and estimate the SOC from the OCV of the secondary battery by referring to the charging curve;

if the second electric quantity is more than a second reference electric quantity, retrieve the discharging curve from the memory, and estimate the SOC from the OCV of the secondary battery by referring to the discharging curve; and if the first electric quantity is less than the first reference electric quantity or if the second electric quantity is less than the second reference electric quantity, retrieve from the memory, the information of the predetermined correspondence relation for supplementing SOC-OCV characteristics of the secondary battery, and estimate the SOC from the OCV of the secondary battery using the predetermined correspondence relation for supplementing SOC-OCV characteristics of the secondary battery in the region enclosed by the charging curve and the discharging curve, wherein, in the SOC estimation process, the controller selectively retrieves from the memory, the charging curve, the discharge curve, or the information of the predetermined correspondence relation for supplementing SOC-OCV characteristics of the secondary battery, based on use history of the secondary battery, while charging or discharging of the secondary battery is continued.

2. The secondary battery system according to claim 1, wherein the first electric quantity is an electric quantity charged to the secondary battery since switching from discharging to charging on the discharging curve, and the second electric quantity is an electric quantity discharged from the secondary battery since switching from charging to discharging on the charging curve.

3. The secondary battery system according to claim 1, wherein the controller is configured to estimate the SOC from the OCV of the secondary battery using, as the correspondence relation, a linear approximation relation between the SOC and the OCV of the secondary battery in the region.

4. The secondary battery system according to claim 3, wherein the memory stores a correlation among a constant of proportionality in the linear approximation relation, a temperature of the secondary battery, and the SOC of the secondary battery, and the controller is configured to execute the SOC estimation process repeatedly, and calculate the constant of proportionality from the temperature of the secondary battery and from the SOC of the secondary battery estimated by the SOC estimation process performed last time.

5. The secondary battery system according to claim 3, wherein the controller is configured to estimate the SOC from the OCV of the secondary battery using a constant of proportionality in the linear approximation relation and using the SOC and the OCV of the secondary battery of a time of switching between charging and discharging.

6. The secondary battery system according to claim 1, wherein, in the SOC estimation process, the controller is configured to:

estimate the SOC from the OCV of the secondary battery by referring to the discharging curve if an electric quantity discharged from the secondary battery since a first reference time is larger than an electric quantity charged to the secondary battery since the first reference time, the first reference time being a time of switching from discharging to charging on the discharging curve; and estimate the SOC from the OCV of the secondary battery by referring to the charging curve if an electric quantity charged to the secondary battery since a second reference time is larger than an electric quantity discharged from the secondary battery since the second reference time, the second reference time being a time of switching from charging to discharging on the charging curve.

7. A method for estimating a SOC of a secondary battery, wherein a charging curve and a discharging curve are predetermined and are stored in a memory, the charging curve representing SOC-OCV characteristics of the secondary battery charged from a fully discharged state to a fully charged state, the discharging curve representing SOC-OCV characteristics of the secondary battery discharged from the fully charged state to the fully discharged state, the method comprising:

if a first electric quantity charged to the secondary battery since switching from discharging to charging is more than a first reference electric quantity, retrieving the charging curve from the memory, and estimating a SOC from an OCV of the secondary battery by referring to the charging curve;

if a second electric quantity discharged from the secondary battery since switching from charging to discharging is more than a second reference electric quantity, retrieving the discharging curve from the memory, and estimating the SOC from the OCV of the secondary battery by referring to the discharging curve; and if the first electric quantity is less than the first reference electric quantity or if the second electric quantity is less than the second reference electric quantity, retrieve from the memory, information of a predetermined correspondence relation for supplementing SOC-OCV characteristics of the secondary battery in a region enclosed by the charging curve and the discharging curve, and estimating the SOC from the OCV of the secondary battery using the predetermined correspondence relation for supplementing SOC-OCV characteristics of the secondary battery, wherein, in estimating the SOC of the secondary battery, the charging curve, the discharge curve, or the information of the predetermined correspondence relation for supplementing SOC-OCV characteristics of the secondary battery, is selectively retrieved from the memory based on use history of the secondary battery, while charging or discharging of the secondary battery is continued.

* * * * *